US009354525B2

(12) United States Patent
Nagasaka

(10) Patent No.: US 9,354,525 B2
(45) Date of Patent: *May 31, 2016

(54) EXPOSURE METHOD, EXPOSURE APPARATUS, AND METHOD FOR PRODUCING DEVICE

(71) Applicant: NIKON CORPORATION, Tokyo (JP)

(72) Inventor: Hiroyuki Nagasaka, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 580 days.

This patent is subject to a terminal disclaimer.

(21) Appl. No.: 13/897,989

(22) Filed: May 20, 2013

(65) Prior Publication Data

US 2013/0250258 A1 Sep. 26, 2013

Related U.S. Application Data

(60) Continuation of application No. 12/222,029, filed on Jul. 31, 2008, now Pat. No. 8,472,001, which is a division of application No. 11/283,724, filed on Nov. 22, 2005, now Pat. No. 7,495,744, which is a continuation of application No. PCT/JP2004/007415, filed on May 24, 2004.

(30) Foreign Application Priority Data

May 23, 2003 (JP) ................................ 2003-146424

(51) Int. Cl.
  *G03F 7/20* (2006.01)
  *G03B 27/42* (2006.01)
(52) U.S. Cl.
  CPC ............ *G03F 7/70341* (2013.01); *G03B 27/42* (2013.01); *G03F 7/2041* (2013.01); *G03F 7/70325* (2013.01)

(58) Field of Classification Search
  CPC ..... G03F 7/709; G03F 7/2041; G03F 7/70325; G03F 7/70341; G03B 27/42
  USPC ........... 355/30, 52, 53, 55, 72, 77; 378/34, 35
  See application file for complete search history.

(56) References Cited

U.S. PATENT DOCUMENTS 4,346,164 A 8/1982 Tabarelli et al.
4,480,910 A 11/1984 Takanashi et al.
(Continued)

FOREIGN PATENT DOCUMENTS

DE 221 563 A1 4/1985
DE 224 448 A1 7/1985
(Continued)

OTHER PUBLICATIONS

May 26, 2015 Office Action issued in European Application No. 14179111.1.
(Continued)

*Primary Examiner* — Toan Ton
*Assistant Examiner* — Mona M Sanei
(74) *Attorney, Agent, or Firm* — Oliff PLC

(57) ABSTRACT

A liquid immersion exposure apparatus in which a substrate is exposed with an exposure beam, includes a projection optical system by which the substrate is exposed to the exposure beam, a first inlet disposed at a first position, which is capable of supplying a first liquid to a space adjacent to a bottom surface of the projection optical system, and a second inlet disposed at a second position which is different from the first position, the second inlet being capable of supplying a second liquid that is different from the first liquid to the space.

40 Claims, 8 Drawing Sheets

(56) References Cited

U.S. PATENT DOCUMENTS

| | | | |
|---|---|---|---|
| 4,509,852 A | 4/1985 | Tabarelli et al. | |
| 5,591,958 A | 1/1997 | Nishi et al. | |
| 5,610,683 A | 3/1997 | Takahashi | |
| 5,715,039 A | 2/1998 | Fukuda et al. | |
| 5,825,043 A | 10/1998 | Suwa | |
| 2002/0036758 A1* | 3/2002 | de Mol et al. | 355/53 |
| 2002/0080339 A1* | 6/2002 | Takahashi | 355/72 |
| 2002/0148483 A1 | 10/2002 | Mertens et al. | |
| 2002/0163629 A1 | 11/2002 | Switkes et al. | |
| 2003/0030916 A1 | 2/2003 | Suenaga | |
| 2003/0096199 A1 | 5/2003 | Nakagawa et al. | |
| 2003/0174298 A1* | 9/2003 | Yoshimura | 355/52 |
| 2003/0174408 A1 | 9/2003 | Rostalski et al. | |
| 2003/0222842 A1* | 12/2003 | Yuasa | 345/107 |
| 2004/0000627 A1 | 1/2004 | Schuster | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0115567 A1 | 6/2004 | Mandal et al. | |
| 2004/0118184 A1 | 6/2004 | Violette | |
| 2004/0119954 A1 | 6/2004 | Kawashima et al. | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Maria Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0233405 A1 | 11/2004 | Kato et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2005/0007569 A1 | 1/2005 | Streefkerk et al. | |
| 2005/0024609 A1 | 2/2005 | De Smit et al. | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0042554 A1 | 2/2005 | Dierichs et al. | |
| 2005/0046934 A1 | 3/2005 | Ho et al. | |
| 2005/0048223 A1 | 3/2005 | Pawloski et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0094116 A1 | 5/2005 | Flagello et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0141098 A1 | 6/2005 | Schuster | |
| 2005/0145803 A1 | 7/2005 | Hakey et al. | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0179877 A1 | 8/2005 | Mulkens et al. | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219499 A1 | 10/2005 | Maria Zaal et al. | |
| 2005/0225737 A1 | 10/2005 | Weissenrieder et al. | |
| 2005/0231694 A1 | 10/2005 | Kolesnychenko et al. | |
| 2005/0237501 A1 | 10/2005 | Furukawa et al. | |
| 2005/0237504 A1 | 10/2005 | Nagasaka et al. | |
| 2005/0243292 A1 | 11/2005 | Baselmans et al. | |
| 2005/0245005 A1 | 11/2005 | Benson | |
| 2005/0253090 A1 | 11/2005 | Gau et al. | |
| 2005/0259232 A1 | 11/2005 | Streefkerk et al. | |
| 2005/0259233 A1 | 11/2005 | Streefkerk et al. | |
| 2005/0270505 A1 | 12/2005 | Smith | |
| 2006/0019204 A1 | 1/2006 | Endo et al. | |
| 2006/0141400 A1 | 6/2006 | Hirayama et al. | |

FOREIGN PATENT DOCUMENTS

| | | |
|---|---|---|
| EP | 0 060 729 A2 | 9/1982 |
| EP | 1 571 695 A1 | 9/2005 |
| EP | 1 571 698 A1 | 9/2005 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-04-305915 | 10/1992 |
| JP | A-04-305917 | 10/1992 |
| JP | A-05-62877 | 3/1993 |
| JP | A-6-124873 | 5/1994 |
| JP | A-6-168866 | 6/1994 |
| JP | A-07-220990 | 8/1995 |
| JP | A-8-316125 | 11/1996 |
| JP | A-10-041213 | 2/1998 |
| JP | A-10-303114 | 11/1998 |
| JP | A-10-340846 | 12/1998 |
| JP | A-11-176727 | 7/1999 |
| JP | A-2000-58436 | 2/2000 |
| WO | WO 99/49504 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004053956 A1 * | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |

(56) References Cited

FOREIGN PATENT DOCUMENTS

| WO | WO 2005/059617 A2 | 6/2005 |
|---|---|---|
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 AI | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |

OTHER PUBLICATIONS

Nov. 3, 2015 Search Report issued in European Patent Application No. 14179112.9.
Nov. 3, 2015 Office Action issued in European Patent Application No. 14179112.9.
Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
Nikon Corporation, Litho Forum, Jan. 28, 2004, "Update on 193 nm immersion exposure tool", S. Owa et al., 51 pages (slides 1-51).
Nikon Corporation, Immersion Lithography Workshop, Dec. 11, 2002, 24 pages (slides 1-24).
Nikon Corporation, Immersion Workshop, Jan. 27, 2004, "Update on 193 nm immersion exposure tool", S. Owa et al., 38 pages (slides 1-38).
Nikon Corporation, 3$^{rd}$ 157 nm symposium, Sep. 4, 2002, "Nikon F2 Exposure Tool", Soichi Owa et al., 25 pages (slides 1-25).
Optical Microlithography XVI, Proceedings of SPIE vol. 5040 (2003), "Immersion lithography; its potential performance and issues", Soichi Owa et al., pp. 724-733.
Nikon Corporation, NGL Workshop, Jul. 10, 2003, "Potential performance and feasibility of immersion lithography", Soichi Owa et al., 33 pages, slides 1-33.
Dec. 2, 2009 Office Action in U.S. Appl. No. 12/222,028.
May 13, 2009 Office Action in U.S. Appl. No. 12/222,028.
May 1, 2008 Notice of Allowance in U.S. Appl. No. 11/283,724.
Jan. 26, 2007 Office Action in U.S. Appl. No. 11/283,724.
Oct. 16, 2007 Notice of Allowance in U.S. Appl. No. 11/283,724.
Mar. 11, 2008 Notice of Allowance in U.S. Appl. No. 11/698,186.
Jun. 14, 2007 Office Action in U.S. Appl. No. 11/698,186.
Mar. 9, 2010 Japanese Office Action in Japanese Application No. 2004-151716, with translation.
Mar. 9, 2010 Japanese Office Action in Japanese Application No. 2004-151715, with translation.
Dec. 21, 2007 Supplementary European Search Report in European Patent Application No. EP 04 734 603.
Dec. 9, 2008 Office Action in European Patent Application No. EP 04 734 603.
Sep. 14, 2004 Written Opinion in International Patent Application No. PCT/JP2004/007415 (with English translation).
Sep. 14, 2004 International Search Report in International Patent Application No. PCT/JP2004/007415 (with English translation).
Jan. 31, 2011 Office Action in Taiwanese Patent Application No. 093114402 (with English translation).
Mar. 1, 2011 Office Action in Japanese Patent Application No. 2004-151716 (with English translation).
Aug. 10, 2010 Office Action in Japanese Patent Application No. 2004-151716 (with English translation).
Jan. 18, 2011 Office Action in Korean Patent Application No. 2005-7022145 (with English translation).
Aug. 10, 2010 Office Action issued in Japanese Patent Application No. 2004-151715, w/translation.
Aug. 30, 2010 Office Action issued in Taiwanese Patent Application No. 093114402 w/translation.
Jun. 7, 2012 Office Action issued in Korean Patent Application No. 10-2012-7010587 w/translation.
Jul. 24, 2012 Office Action issued in Japanese Patent Application No. 2010-108738 w/translation.
Jul. 24, 2012 Office Action issued in Japanese Patent Application No. 2010-108698 w/translation.
Nov. 26, 2011 Office Action in Taiwanese Patent Application No. 093114402 (with English translation).
Feb. 2, 2012 Office Action in U.S. Appl. No. 12/222,028.
English language translation of Pforr (DD 221563 A1).
May 24, 2011 Office Action issued in U.S. Appl. No. 12/222,028.

* cited by examiner

EXPOSURE METHOD, EXPOSURE APPARATUS, AND METHOD FOR PRODUCING DEVICE

CROSS-REFERENCE

This application is a Continuation of U.S. patent application Ser. No. 12/222,029 filed Jul. 31, 2008, which in turn is a Division of U.S. patent application Ser. No. 11/283,724 filed Nov. 22, 2005 and issued as U.S. Pat. No. 7,495,744, which in turn is a Continuation of International Application No. PCT/JP2004/007415 filed May 24, 2004 claiming the conventional priority of Japanese patent Application No, 2003-146424 filed on May 23, 2003. The disclosure of each of these prior applications is incorporated herein by reference in its entirety.

BACKGROUND OF THE INVENTION

1. Field of the Invention

The present invention relates to an exposure method, an exposure apparatus, and a method for producing a device in which a substrate is exposed by projecting an image of a pattern onto the substrate via a projection optical system and a liquid.

2. Description of the Related Art

Semiconductor devices and liquid crystal display devices are produced by means of the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, λ represents the exposure wavelength, NA represents the numerical aperture of the projection optical system, and $k_1$ and $k_2$ represent the process coefficients. According to the expressions (1) and (2), the following fact is appreciated. That is, when the exposure wavelength λ, is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

Usually, a variety of materials are used for films including, for example, the photoresist layer which is provided on the substrate as the exposure objective and the top coat layer which is provided as the upper layer formed thereon, wherein the film serves as the contact surface with respect to liquid of the liquid immersion area to be formed in the liquid immersion exposure. When the type of the film is changed, the affinity for the liquid for the liquid immersion exposure is changed. In the case of the liquid immersion exposure, the operation for supplying the liquid onto the substrate and the operation for recovering the liquid from the surface of the substrate are performed. When the affinity of the liquid for the film is changed, there is such a possibility that the liquid recovery operation and the liquid supply operation cannot be performed smoothly. In such a situation, the versatility of the liquid immersion exposure apparatus is conspicuously deteriorated.

SUMMARY OF THE INVENTION

The present invention has been made taking the foregoing circumstances into consideration, an object of which is to provide an exposure method, an exposure apparatus, and a method for producing a device wherein the liquid immersion exposure can be performed smoothly for substrates each of which is provided with a film of any different type. In particular, an object of the present invention is to provide an exposure method, an exposure apparatus, and a method for producing a device wherein the liquid immersion exposure can be realized under a liquid immersion condition optimized for any one of a variety of films formed on substrates.

In order to achieve the objects as described above, the present invention adopts the following constructions.

According to a first aspect of the present invention, there is provided an exposure method for exposing a substrate by projecting an image of a pattern onto the substrate through a liquid; the exposure method comprising determining a liquid immersion condition for the substrate depending on a film formed as a liquid contact surface of the substrate; and exposing the substrate under the determined liquid immersion condition.

According to the present invention, the liquid immersion condition, under which the substrate is exposed through the liquid, is determined depending on the film formed as the liquid contact surface of the substrate, specifically a photoresist layer or a top coat layer formed as the upper layer thereof. When a plurality of substrates, on which the films of the different types are provided respectively, are subjected to the liquid immersion exposure, each of the substrates can be subjected to the exposure under the determined optimum liquid immersion condition. In this specification, the term "liquid immersion condition" means the condition for forming the liquid immersion area on the substrate when the substrate is exposed through the liquid, which is the concept that includes, for example, the condition for supplying the liquid onto the substrate, the condition for recovering the liquid from the surface of the substrate, and the type of the liquid to be supplied onto the substrate.

According to a second aspect of the present invention, there is provided an exposure apparatus which exposes a substrate by projecting an image of a pattern onto the substrate through a liquid, the exposure apparatus comprising: a projection optical system which projects the image of the pattern onto the substrate; and a liquid supply mechanism which supplies the liquid; wherein the liquid supply mechanism changes the liquid to be supplied, depending on a film formed as a liquid contact surface of the substrate.

According to the exposure apparatus of the present invention, the liquid, which is to be used for the liquid immersion exposure, is changed depending on the film formed as the liquid contact surface of the substrate. Accordingly, the liquid immersion exposure can be performed under the satisfactory liquid immersion condition for each of a plurality of substrates on which the films of the different types are provided respectively.

According to a third aspect of the present invention, there is provided an exposure apparatus which exposes a substrate by projecting an image of a pattern onto the substrate through a liquid, the exposure apparatus comprising: a projection optical system which projects the image of the pattern onto the substrate; and a measuring unit which measures an affinity between the liquid and a film formed as a liquid contact surface of the substrate.

According to the present invention, the measuring unit is provided, which measures the affinity between the liquid for the liquid immersion exposure and the film formed as the liquid contact surface of the substrate. Accordingly, the optimum liquid immersion condition can be determined on the basis of the result of the measurement. Therefore, even when the liquid immersion exposure is performed for each of a plurality of substrates on which the films of the different types are provided respectively, the respective substrates can be smoothly subjected to the exposure process under the satisfactory liquid immersion conditions.

According to a fourth aspect of the present invention, there is provided an exposure apparatus which exposes a substrate by projecting an image of a pattern onto the substrate through a liquid, the exposure apparatus comprising: a projection optical system which projects the image of the pattern onto the substrate; and a storage unit which stores a plurality of relationships between an affinity for the liquid and a liquid immersion condition corresponding to the affinity; wherein the liquid immersion condition is selected from the storage unit depending on a film formed as a liquid contact surface of the substrate.

According to the present invention, the relationship between the affinity of the film for the liquid and the liquid immersion condition corresponding thereto is previously stored in the storage unit. Accordingly, the optimum liquid immersion condition can be selected and determined depending on the information about the film to be exposed. Therefore, even when the liquid immersion exposure is performed for each of a plurality of substrates on which the films of the different types are provided respectively, the respective substrates can be smoothly subjected to the exposure process under the satisfactory liquid immersion conditions.

According to a fifth aspect of the present invention, there is provided an exposure apparatus which exposes a substrate by projecting an image of a pattern onto the substrate through a liquid, the exposure apparatus comprising: a projection optical system which projects the image of the pattern onto the substrate; and a storage unit which stores relationships between a variety of films formable as a liquid contact surface of the substrate and liquid immersion conditions suitable for the respective films. According to this exposure apparatus, the storage unit stores the films and the liquid immersion conditions optimized for the respective films. Accordingly, when the film is determined, it is possible to instantaneously select, from the storage unit, the optimum liquid immersion condition including, for example, the condition for supplying the liquid onto the substrate, the condition for recovering the liquid from the surface of the substrate, and the type of the liquid to be supplied onto the substrate. Therefore, even when the exposure objective is changed and/or the film is changed upon the liquid immersion exposure, then it is possible to make response quickly under the optimum liquid immersion condition. The exposure apparatus may further comprise a control unit which sets a liquid immersion condition by selecting the liquid immersion condition among the liquid immersion conditions from the storage unit depending on a film to be used for liquid immersion exposure. Accordingly, it is possible to automatically perform the optimum liquid immersion exposure.

According to a sixth aspect of the present invention, there is provided an exposure apparatus which exposes a substrate by projecting an image of a pattern onto the substrate through a liquid, the exposure apparatus comprising: a projection optical system which projects the image of the pattern onto the substrate; and a liquid supply mechanism which has a supply port for supplying the liquid; wherein at least one of a size and a shape of the supply port is changeable. According to this exposure apparatus, at least one of the size and the shape of the supply port is changeable. Therefore, for example, even when the exposure objective is changed and/or the film is changed upon the liquid immersion exposure, then it is possible to make response quickly under the optimum liquid immersion condition.

According to a seventh aspect of the present invention, there is provided an exposure apparatus which exposes a substrate by projecting an image of a pattern onto the substrate through a liquid, the exposure apparatus comprising: a projection optical system which projects the image of the pattern onto the substrate; and a liquid recovery mechanism which has a recovery port for recovering the liquid; wherein at least one of a size and a shape of the recovery port is changeable. According to this exposure apparatus, at least one of the size and the shape of the recovery port is changeable. Therefore, for example, even when the exposure objective is changed and/or the film is changed upon the liquid immersion exposure, then it is possible to make response quickly under the optimum liquid immersion condition.

According to an eighth aspect of the present invention, there is provided a method for producing a device, comprising using the exposure method as defined in the aspect described above. According to a ninth aspect of the present invention, there is provided a method for producing a device, comprising using the exposure apparatus as defined in any one of the aspects described above. According to the present invention, the pattern can be transferred at a high pattern transfer accuracy under the satisfactory liquid immersion condition for a variety of types of substrates. It is possible to provide the device capable of exhibiting desired performance.

DESCRIPTION OF THE PREFERRED EMBODIMENTS OF THE INVENTION

An explanation will be made below about the exposure apparatus according to the present invention with reference to the drawings. However, the present invention is not limited thereto.

Figure 1:
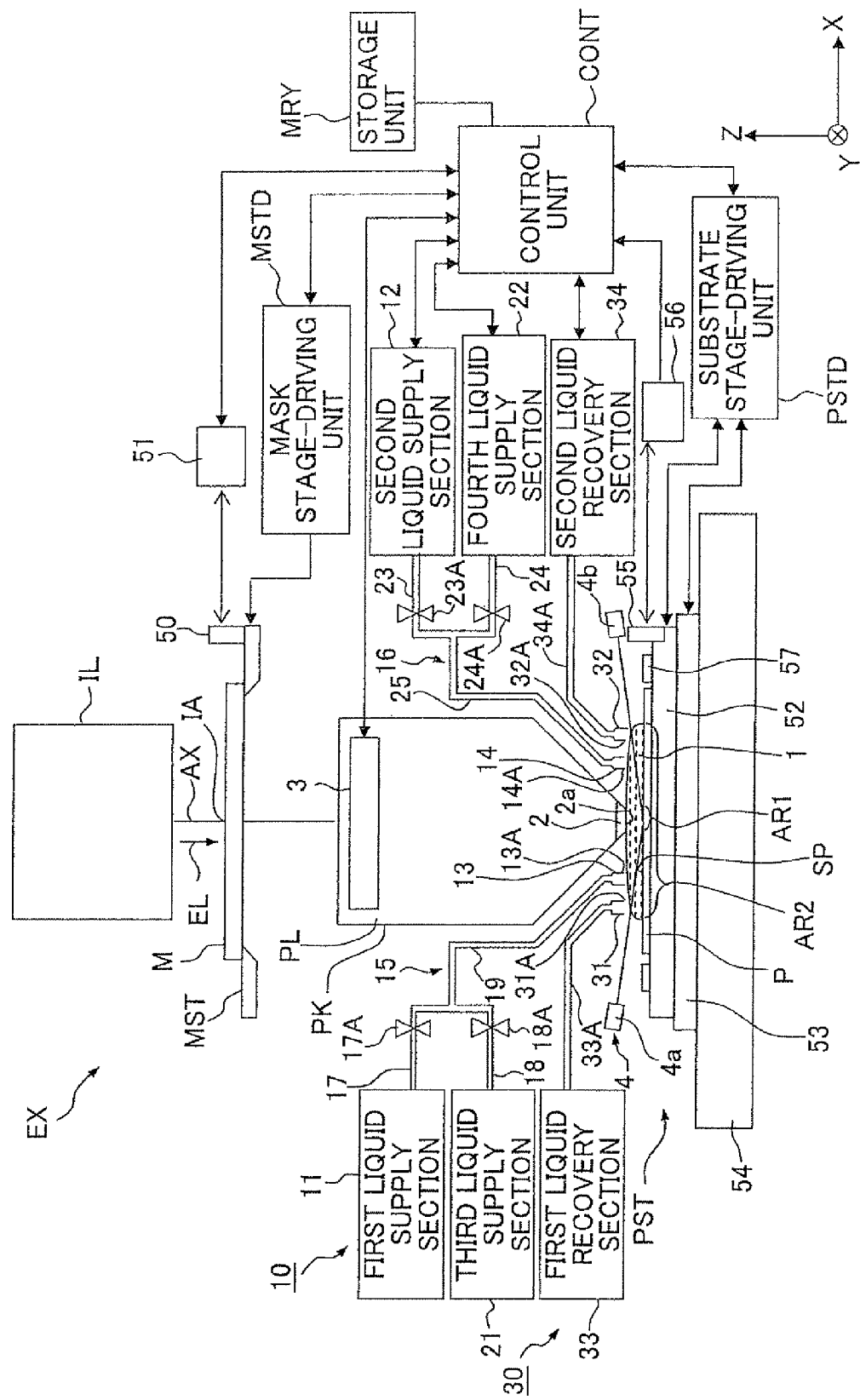
FIG. 1 shows a schematic arrangement illustrating an embodiment of the exposure apparatus of the present invention.

FIG. 1 shows a schematic arrangement illustrating an embodiment of the exposure apparatus of the present invention. With reference to FIG. 1, an exposure apparatus EX includes a mask stage MST which supports a mask (reticle) M, a substrate stage PST which supports a substrate P, an illumination optical system IL which illuminates, with an exposure light beam EL, the mask M supported by the mask stage MST, a projection optical system PL which performs projection exposure for the substrate P supported by the substrate stage PST with an image of a pattern of the mask M illuminated with the exposure light beam EL, a control unit CONT which collectively controls the overall operation of the exposure apparatus EX, and a storage unit MRY which is connected to the control unit CONT and which stores various pieces of information about the exposure operation.

The exposure apparatus EX of this embodiment is a liquid immersion exposure apparatus to which the liquid immersion method is applied in order that the exposure wavelength is substantially shortened to improve the resolution and the depth of focus is substantially widened. The exposure apparatus EX includes a liquid supply mechanism 10 which supplies the liquid 1 onto the substrate P, and a liquid recovery mechanism 30 which recovers the liquid 1 from the surface of the substrate P. The exposure apparatus EX forms a liquid immersion area AR2 on at least a part of the substrate P including a projection area AR1 of the projection optical system PL by the liquid 1 supplied from the liquid supply mechanism 10 at least during the period in which the pattern image of the mask M is transferred onto the substrate P. Specifically, the exposure apparatus EX is operated as follows. That is, the space between the surface (exposure surface) of the substrate P and the optical element 2 disposed at the end portion of the projection optical system PL is filled with the liquid 1. The pattern image of the mask M is projected onto the substrate P to expose the substrate P therewith via the projection optical system PL and the liquid 1 disposed between the projection optical system PL and the substrate P.

The embodiment of the present invention will now be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions (predetermined directions). In the following explanation, the X axis direction is the synchronous movement direction (scanning direction, predetermined direction) for the mask M and the substrate P in the horizontal plane, the Y axis direction (non-scanning direction) is the direction which is perpendicular to the X axis direction in the horizontal plane, and the Z axis direction is the direction which is perpendicular to the X axis direction and the Y axis direction and which is coincident with the optical axis AX of the projection optical system PL. The directions about the X axis, the Y axis, and the Z axis are designated as $\theta X$, $\theta Y$, and $\theta Z$ directions respectively.

The substrate P is provided with a film SP which is formed on the base material for the device (semiconductor wafer or glass substrate) and which is composed of a photoresist layer or a top coat layer (protective layer) provided as an upper layer of the photoresist layer. Therefore, the film SP, which is provided at the uppermost layer of the substrate P, forms the liquid contact surface which makes contact with the liquid 1 during the liquid immersion exposure. For example, P6111 produced by TOKYO OHKA KOGYO CO., LTD. is used as the photoresist layer. For example, TSP-3A produced by TOKYO OHKA KOGYO CO., LTD. is used as the top coat layer. The liquid immersion condition is determined depending on the material characteristics of the films as described above, especially depending on the contact angle or the wettability with respect to the liquid to be used.

The illumination optical system IL is used so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL supplied from the optical integrator, a relay lens system, and a variable field diaphragm which sets the illumination area IA on the mask M illuminated with the exposure light beam EL to be slit-shaped. The predetermined illumination area IA on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

The mask stage MST supports the mask M. The mask stage MST is two-dimensionally movable in the plane perpendicular to the optical axis AX of the projection optical system PL, i.e., in the XY plane, and it is finely rotatable in the $\theta z$ direction. The mask stage MST is driven by a mask stage-driving unit MSTD such as a linear motor. The mask stage-driving unit MSTD is controlled by the control unit CONT. A movement mirror 50 is provided on the mask stage MST. A laser interferometer 51 is provided at a position opposed to the movement mirror 50. The position in the two-dimensional direction and the angle of rotation of the mask M on the mask stage MST are measured in real-time by the laser interferometer 51. The result of the measurement is outputted to the control unit CONT. The control unit CONT drives the mask stage-driving unit MSTD on the basis of the result of the measurement obtained by the laser interferometer 51 to thereby position the mask M supported on the mask stage MST.

The projection optical system PL projects the pattern on the mask M onto the substrate P at a predetermined projection magnification to perform the exposure. The projection optical system PL includes a plurality of optical elements including the optical element (lens) 2 provided at the end portion on the side of the substrate P. The optical elements are supported by a barrel PK. The projection optical system PL is provided with an image formation characteristic control unit 3 which is capable of adjusting the image formation characteristic (optical characteristic) of the projection optical system PL. The image formation characteristic control unit 3 includes an optical element-driving mechanism which is capable of moving a part of the plurality of optical elements for constructing the projection optical system PL, and a pressure-adjusting mechanism which adjusts the pressure of the specified space among the spaces between the plurality of optical elements in the barrel PK. The optical element-driving mechanism moves, in the direction of the optical axis AX, the specified optical element included in the plurality of optical elements for constructing the projection optical system PL, and the optical element-driving mechanism inclines the optical element with respect to the optical axis AX. The image formation characteristic control unit 3 is controlled by the control unit CONT. The control unit CONT is capable of adjusting the image plane position and the projection magnification of the projection optical system PL by the aid of the image formation characteristic control unit 3.

In this embodiment, the projection optical system PL is based on the reduction system having the projection magnification β which is, for example, ¼ or ⅕. The projection optical system PL may be any one of the 1× magnification system and the magnifying system. The optical element 2, which is disposed at the end portion of the projection optical system PL of this embodiment, is provided detachably (exchangeably) with respect to the barrel PK. The optical element 2, which is disposed at the end portion, is exposed from the barrel PK. The liquid 1 in the liquid immersion area AR2 makes contact with the optical element 2. Accordingly, the barrel PK formed of metal can be prevented from any corrosion or the like.

The exposure apparatus EX further includes a focus-detecting system 4. The focus-detecting system 4 has a light-emitting section 4a and a light-receiving section 4b. The detecting light beam is projected in an oblique direction onto the surface (exposure surface) of the substrate P via the liquid 1 from the light-emitting section 4a. The reflected light beam therefrom is received by the light-receiving section 4b. The control unit CONT controls the operation of the focus-detecting system 4. Further, the position (focus position) in the Z axis direction of the surface of the substrate P with respect to a predetermined reference surface is detected on the basis of a light-receiving result obtained by the light-receiving section 4b. Respective focus positions at a plurality of respective points on the surface of the substrate P are determined by using the focus-detecting system 4. Accordingly, it is also possible to detect the posture of the substrate P in an inclined direction.

The substrate stage PST supports the substrate P. The substrate stage PST includes a Z stage 52 which holds the substrate P by the aid of a substrate holder, an XY stage 53 which supports the Z stage 52, and a base 54 which supports the XY stage 53. The substrate stage PST is driven by a substrate stage-driving unit PSTD such as a linear motor. The substrate stage-driving unit PSTD is controlled by the control unit CONT. It goes without saying that the Z stage and the XY stage may be provided as an integrated body. When the XY stage 53 of the substrate stage PST is driven, the substrate P is subjected to the control of the position in the XY directions (position in the direction substantially parallel to the image plane of the projection optical system PL).

A movement mirror 55, which is movable together with the substrate stage PST with respect to the projection optical system PL, is provided on the substrate stage PST (Z stage 52). A laser interferometer 56 is provided at a position opposed to the movement mirror 55. The angle of rotation and the position in the two-dimensional direction of the substrate P on the substrate stage PST are measured in real-time by the laser interferometer 56. The result of the measurement is outputted to the control unit CONT. The control unit CONT drives the XY stage 53 by the aid of the substrate stage-driving unit PSTD on the basis of the result of the measurement of the laser interferometer 56 to thereby position the substrate P supported on the substrate stage PST in the X axis direction and the Y axis direction.

The control unit CONT drives the Z stage 52 of the substrate stage PST by the aid of the substrate stage-driving unit PSTD. Accordingly, the control unit CONT controls the position (focus position) in the Z axis direction of the substrate P held by the Z stage 52 and the position in the θX direction and the θY direction. That is, the Z stage 52 is operated on the basis of the instruction from the control unit CONT based on the result of the detection performed by the focus-detecting system 4. The focus position (Z position) and the angle of inclination of the substrate P are controlled so that the surface (exposure surface) of the substrate P is allowed to coincide with the image plane formed via the projection optical system PL and the liquid 1.

An auxiliary plate 57 having a flat surface is provided on the substrate stage PST (Z stage 52) so that the substrate P is surrounded thereby. The auxiliary plate 57 is provided so that the surface has approximately the same height as that of the surface of the substrate P held by the substrate holder. In this arrangement, a gap of about 1 to 2 mm is formed between the auxiliary plate 57 and the edge of the substrate P. However, the liquid 1 scarcely flows into the gap owing to the surface tension of the liquid 1. Even when the vicinity of the circumferential edge of the substrate P is subjected to the exposure, the liquid 1 can be retained under the projection optical system PL by the aid of the auxiliary plate 57.

The liquid supply mechanism 10 supplies the liquid 1 for the liquid immersion exposure onto the substrate P. The liquid supply mechanism 10 is capable of supplying a plurality of types of liquids 1. In this embodiment, the liquid supply mechanism 10 is capable of supplying two types of liquids 1, i.e., pure water as a first liquid and fluorine-based oil (fluorine-based fluid) as a second liquid. The liquid supply mechanism 10 includes a first liquid supply section 11 and a second liquid supply section 12 which are capable of feeding the first liquid (pure water), a third liquid supply section 21 and a fourth liquid supply section 22 which are capable of feeding the second liquid (fluorine-based oil), a first piping system 15 which is connected to the first liquid supply section 11 and the third liquid supply section 21, which selects any one of the first liquid (pure water) and the second liquid (fluorine-based oil), and which supplies the selected liquid 1 onto the substrate P, and a second piping system 16 which is connected to the second liquid supply section 12 and the fourth liquid supply section 22, which selects any one of the first liquid (pure water) and the second liquid (fluorine-based oil), and which supplies the selected liquid 1 onto the substrate P.

Figure 2:
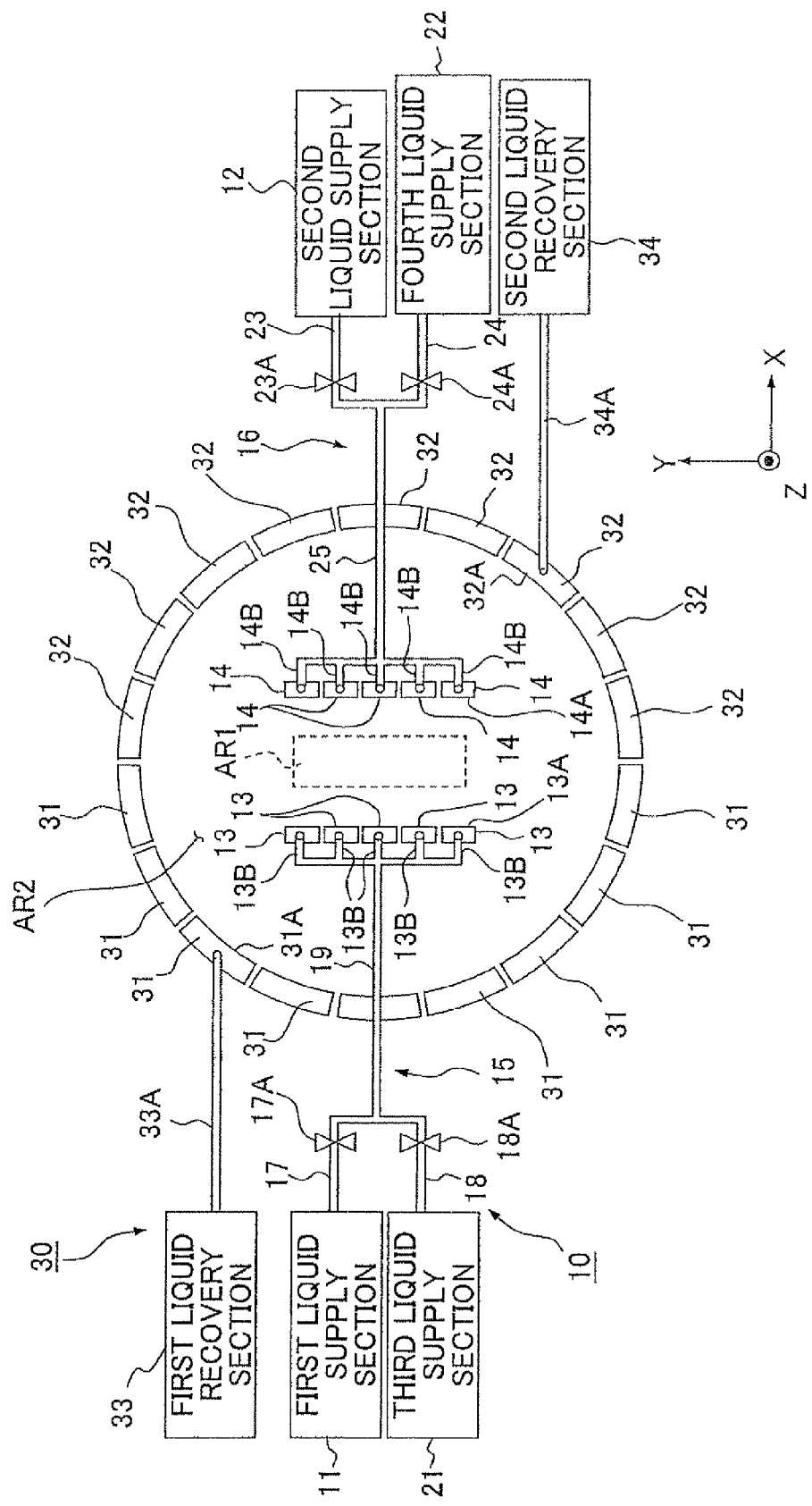
FIG. 2 shows a plan view illustrating an exemplary arrangement of a liquid supply mechanism and a liquid recovery mechanism in the embodiment of the present invention.

FIG. 2 shows a plan view illustrating a schematic arrangement of the liquid supply mechanism 10 and the liquid recovery mechanism 30. As shown in FIGS. 1 and 2, the first piping system 15 is provided with a supply tube 19 through which the liquid 1 flows, the liquid 1 being fed from any one of the first liquid supply section 11 and the third liquid supply section 21. One end of the supply tube 19 is connected to the first liquid supply section 11 and the third liquid supply section 21 via tubes 17, 18 respectively. On the other hand, the other end of the supply tube 19 is connected to a plurality of first supply members 13 via a plurality of branch tubes 13B respectively. The plurality of first supply members 13 are arranged while being aligned in the Y axis direction. Supply ports 13A of the first supply members 13 are arranged closely to the surface of the substrate P while being directed thereto. In this embodiment, five of the first supply members 13 are arranged in an aligned manner. The first supply members 13 are provided on one side (−X side) in the scanning direction with respect to the projection area AR1 of the projection optical system PL designed to be slit-shaped (rectangular) in which the Y axis direction (non-scanning direction) is the longitudinal direction.

The tubes 17, 18 are provided with valves 17A, 18A respectively. The operation of the valves 17A, 18A is controlled by the control unit CONT. The control unit CONT opens the tube 17 and closes the tube 18 by using the valves 17A, 18A to drive the first liquid supply section 11. Accordingly, the first liquid (pure water) is supplied from the first liquid supply section 11 via the tube 17, the supply tube 19, the first supply member 13, and the supply port 13A onto the substrate P. On the other hand, the control unit CONT opens the tube 18 and closes the tube 17 by using the valves 17A, 18A to drive the third liquid supply section 21. Accordingly, the second liquid (fluorine-based oil) is supplied from the third liquid supply section 21 via the tube 18, the supply tube 19, the first supply member 13, and the supply port 13A onto the substrate P.

The second piping system 16 is provided with a supply tube 25 through which the liquid 1 flows, the liquid 1 being fed from any one of the second liquid supply section 12 and the fourth liquid supply section 22. One end of the supply tube 25 is connected to the second liquid supply section 12 and the fourth liquid supply section 22 via tubes 23, 24 respectively. On the other hand, the other end of the supply tube 25 is connected to a plurality of second supply members 14 via a plurality of branch tubes 14B respectively. The plurality of second supply members 14 are arranged while being aligned in the Y axis direction. Supply ports 14A of the second supply members 14 are arranged closely to the surface of the substrate P. In the same manner as the first supply member 13, five of the second supply members 14 are arranged in an aligned manner. The second supply members 14 are provided on the other side (+X side) in the scanning direction with respect to the projection area AR1.

The tubes 23, 24 are provided with valves 23A, 24A respectively. The operation of the valves 23A, 24A is controlled by the control unit CONT. The control unit CONT opens the tube 23 and closes the tube 24 by using the valves 23A, 24A to drive the second liquid supply section 12. Accordingly, the first liquid (pure water) is supplied from the second liquid supply section 12 via the tube 23, the supply tube 25, the second supply member 14, and the supply port 14A onto the substrate P. On the other hand, the control unit CONT opens the tube 24 and closes the tube 23 by using the valves 23A, 24A to drive the fourth liquid supply section 22. Accordingly, the second liquid (fluorine-based oil) is supplied from the fourth liquid supply section 22 via the tube 24, the supply tube 25, the second supply member 14, and the supply port 14A onto the substrate P.

Each of the first to fourth liquid supply sections 11, 12, 21, 22 includes, for example, a tank for accommodating the liquid 1, and a pressurizing pump. The operation of each of the first to fourth liquid supply sections 11, 12, 21, 22 for supplying the liquid is controlled by the control unit CONT. The control unit CONT is capable of independently controlling the liquid supply amounts per unit time to be supplied onto the substrate P by the first to fourth liquid supply sections 11, 12, 21, 22 respectively. Each of the first to fourth liquid supply sections 11, 12, 21, 22 includes a temperature-adjusting mechanism for the liquid 1. The liquid 1, which has approximately the same temperature of 23° C. as the temperature in the chamber for accommodating the apparatus therein, can be supplied onto the substrate P.

As described above, the liquid supply mechanism 10 performs the liquid supply operation in order to selectively use the plurality of (two types of, in this embodiment) liquids 1 for the liquid immersion exposure by using the piping systems 15, 16. As shown in FIG. 2, the liquid immersion area AR2, which is filled with the liquid 1, is formed on a part of the substrate P so that the liquid immersion area AR2 includes the projection area AR1. The liquid supply mechanism 10 simultaneously supplies the liquid 1 from the both sides of the projection area AR1 from the supply ports 13A, 14A of the plurality of first and second supply members 13, 14 respectively.

An explanation will be made below about a case in which the liquid supply mechanism 10 supplies pure water as the liquid 1 for the liquid immersion exposure. Even when the exposure light beam EL is the ArF excimer laser, the exposure light beam EL is transmissive through pure water. Further, the emission lines (g-ray, h-ray, i-ray) in the ultraviolet region and the far ultraviolet light beam (SUV light beam) such as the KrF excimer laser beam (wavelength: 248 nm) are also transmissive through pure water. On the other hand, the optical element 2, which is disposed at the end portion of the projection optical system PL, is formed of fluorite. Fluorite has the high affinity for pure water. Therefore, it is possible to allow the liquid 1 to make tight contact with the substantially entire surface of the liquid contact surface 2a of the optical element 2. In this embodiment, it is also allowable to use quartz which has the high affinity for water and with which the tight contact performance is enhanced between the liquid 1 and the liquid contact surface 2a of the optical element 2, because of the supply of the liquid (pure water) 1 which has the high affinity for the liquid contact surface 2a of the optical element 2. A water-attracting (lyophilic or liquid-attracting) treatment may be applied to the liquid contact surface 2a of the optical element 2 to further enhance the affinity for the liquid 1.

The liquid recovery mechanism 30 recovers the liquid 1 from the surface of the substrate P. The liquid recovery mechanism 30 includes a plurality of first and second recovery members 31, 32 which have recovery ports 31A, 32A arranged closely to the surface of the substrate P, and first and second liquid recovery sections 33, 34 which are connected to the first and second recovery members 31, 32 via recovery tubes 33A, 34A respectively. The recovery tube 33A is connected to the respective first recovery members 31, and the recovery tube 34A is also connected to the respective second recovery members 32. However, they are partially omitted from the illustration in FIG. 2. The plurality of first recovery members 31 are arranged in a substantially circular arc-shaped form on the −X side of the projection area AR1. The recovery ports 31A thereof are arranged so that they are directed to the surface of the substrate P. On the other hand, the plurality of second recovery members 32 are arranged in a substantially circular arc-shaped form on the +X side of the projection area AR1. The recovery ports 32A thereof are arranged so that they are directed to the surface of the substrate P. The plurality of first and second recovery members 31, 32 are arranged to surround the projection area AR1 and the first and second supply members 13, 14 of the liquid supply mechanism 10.

Each of the first and second liquid recovery sections 33, 34 includes, for example, a sucking unit such as a vacuum pump, and a tank for accommodating the recovered liquid 1. The liquid 1 on the substrate P is recovered by the aid of the first and second recovery members 31, 32 and the recovery tubes 33A, 34A. The operation for recovering liquid by the first and second liquid recovery sections 33, 34 is controlled by the control unit CONT. The control unit CONT is capable of controlling the liquid recovery amount (recovery power) per unit time to be recovered by the first and second liquid recovery sections 33, 34. The liquid 1, which is supplied onto the substrate P from the supply ports of the first and second supply members 13, 14, is supplied so that the liquid 1 is spread while causing the wetting between the substrate P and the lower end surface of the end portion (optical element 2) of the projection optical system PL. The liquid 1, which outflows to the outside of the first and second supply members 13, 14 with respect to the projection area AR1, is recovered by the recovery ports of the first and second recovery members 31, 32 which are disposed outside the first and second supply members 13, 14 with respect to the projection area AR1.

Figure 3A:
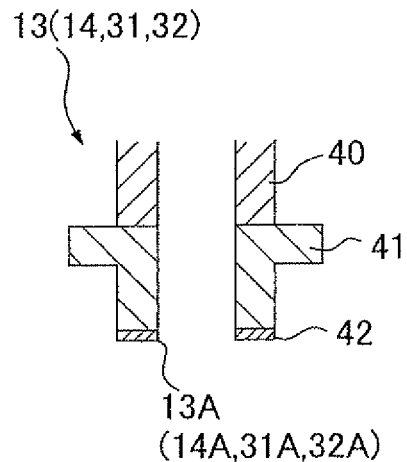
FIGS. 3A to 3D show sectional views illustrating an embodiment of a supply member and a recovery member.
Figure 3B:
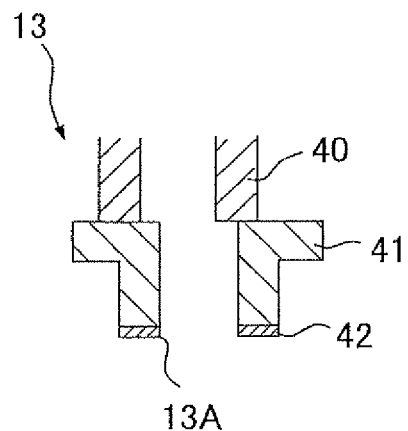
Figure 3C:
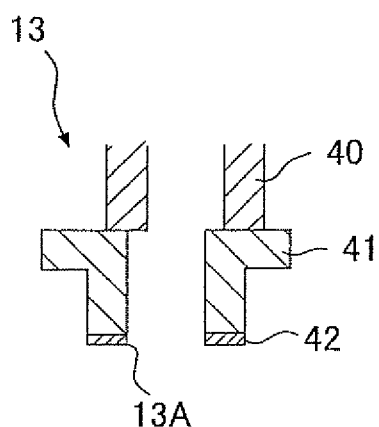
Figure 3D:
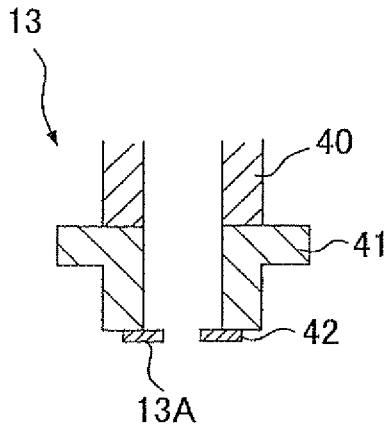
Figure 3D:
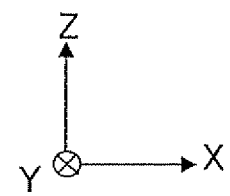

FIGS. 3A to 3D show magnified sectional views illustrating the first supply member 13. With reference to FIG. 3A, the first supply member 13 includes a main body member 40, a slide member 41 which is slidable in the X direction with respect to the main body member 40 under the main body member 40, and a shutter member 42 which is provided at the supply port 13A disposed at the lower end of the slide member 41 and which is capable of changing the size of the supply port 13A by making the sliding movement in the x direction with respect to the slide member 41. The slide member 41 and the shutter member 42 undergo the sliding movement by an unillustrated driving unit. As shown in FIG. 3B, when the slide member 41 is moved in the +X direction with respect to the main body member 40, the position of the supply port 13A is moved toward the +X side. On the other hand, as shown in FIG. 3C, when the slide member 41 is moved in the −X direction with respect to the main body member 40, the position of the supply port 13A is moved toward the −X side. Further, as shown in FIG. 3D, when the shutter member 42 is moved toward the inside of the supply port 13A, the supply port 13A is decreased in size.

The second supply member 14, the first recovery member 31, and the second recovery member 32 are constructed equivalently to the first supply member 13 respectively. Therefore, the second supply member 14 is capable of changing the position and the size of the supply port 14A. It is also allowable that only one of the position and the size is changeable for the supply ports 13A, 14A. Similarly, the first and second recovery members 31, 32 are capable of changing the positions and the sizes of the recovery ports 31A, 32A respectively. As for the recovery ports 31A, 32A, it is also allowable that only one of the position and the size thereof is changeable.

Figure 4A:
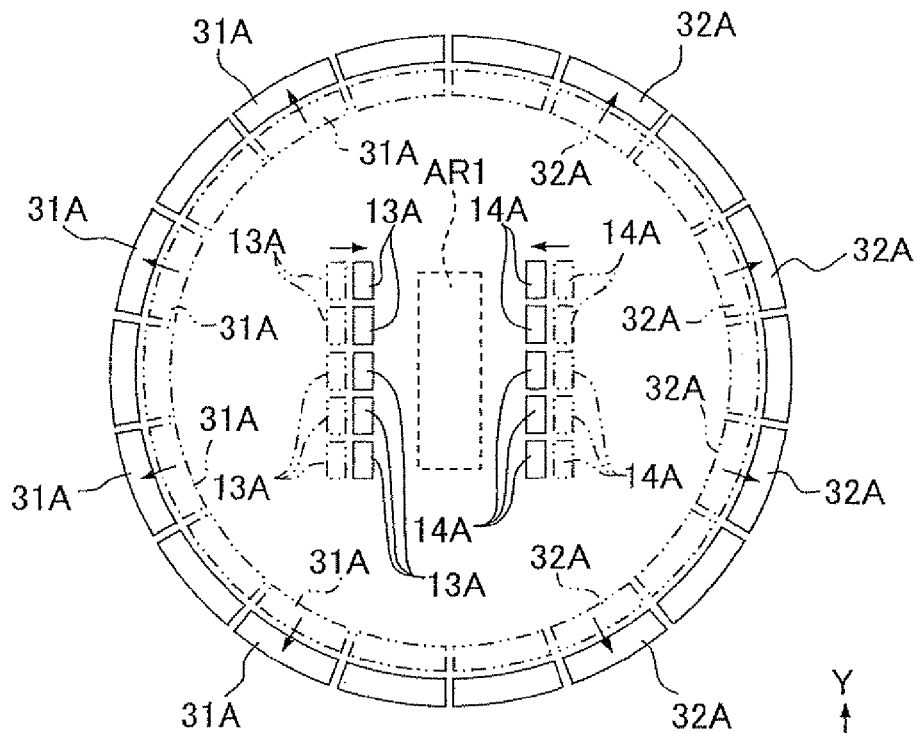
FIGS. 4A and 4B schematically illustrate the situation in which the liquid supply positions and the liquid recovery positions are changed.
Figure 4B:
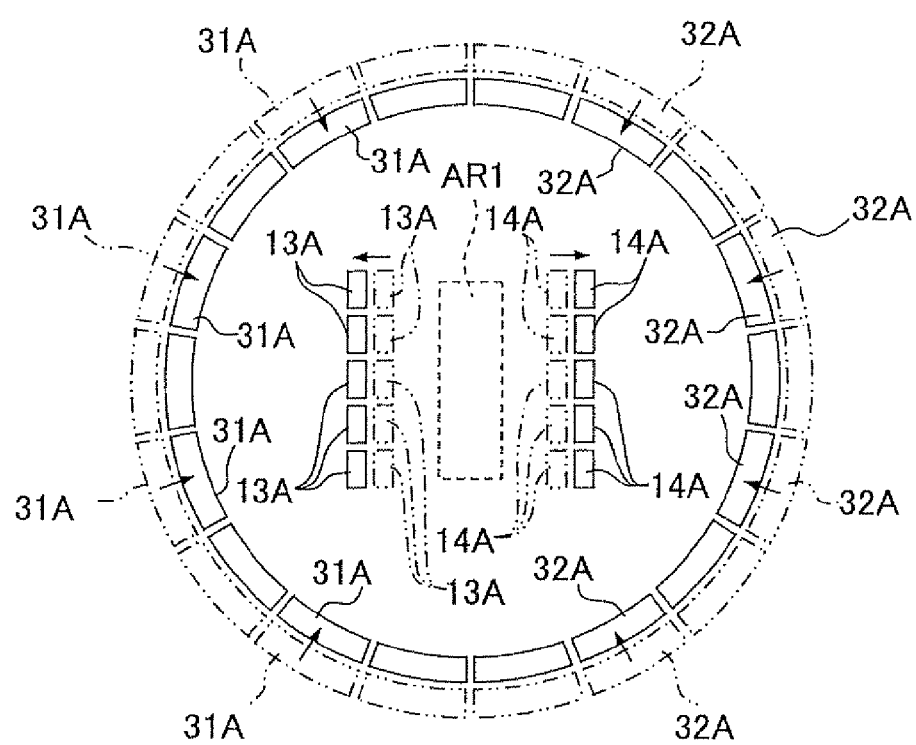

FIGS. 4A and 4B schematically show the situation in which the liquid supply positions of the first and second supply members 13, 14 and the liquid recovery positions of the first and second recovery members 31, 32 are changed. As shown in FIG. 4A, when the control unit CONT drives the driving units for the first and second supply members 13, 14 and the driving units for the first and second recovery members 31, 32, then the liquid supply positions for supplying the liquid by the first and second supply members 13, 14 are successfully allowed to approach the projection area AR1 of the projection optical system PL, and the liquid recovery positions for recovering the liquid by the first and second recovery members 31, 32 are successfully separated from the projection area AR1. On the other hand, as shown in FIG. 4B, when the control unit CONT drives the driving units for the first and second supply members 13, 14 and the driving units for the first and second recovery members 31, 32, then the liquid supply positions for supplying the liquid by the first and second supply members 13, 14 are successfully separated from the projection area AR1, and the liquid recovery positions for recovering the liquid by the first and second recovery members 31, 32 are successfully allowed to approach the projection area AR1. The liquid supply positions for supplying the liquid by the first and second supply members 13, 14 and the liquid recovery positions for recovering the liquid by the first and second recovery members 31, 32 can be adjusted independently respectively.

Next, an explanation will be made about a method for exposing the substrate P by projection with the image of the pattern of the mask M via the projection optical system PL and the liquid 1 of the liquid immersion area AR2 by using the exposure apparatus EX as described above.

The exposure apparatus EX of this embodiment performs the projection exposure for the substrate P with the pattern image of the mask M while moving the mask M and the substrate P in the X axis direction (scanning direction). In the case of the exposure apparatus EX, a part of the pattern image of the mask M corresponding to the illumination area IA is projected onto the slit-shaped (rectangular) projection area AR1 disposed just under the end portion of the projection optical system PL. Further, the mask M is moved at the velocity V in the −x direction (or in the +X direction) with respect to the projection optical system PL, in synchronization with which the substrate P is moved at the velocity $\beta \cdot V$ ($\beta$ represents the projection magnification) in the +X direction (or in the −X direction) by the aid of the XY stage 53. Accordingly, the scanning exposure is performed. A plurality of shot areas are established on the substrate P. After the completion of the exposure for one shot area, the next shot area is moved to the scanning start position in accordance with the stepping movement of the substrate P. After that, the scanning exposure process is successively performed for each of the shot areas SA while moving the substrate P in synchronization with the step-and-scan system.

Figure 5:
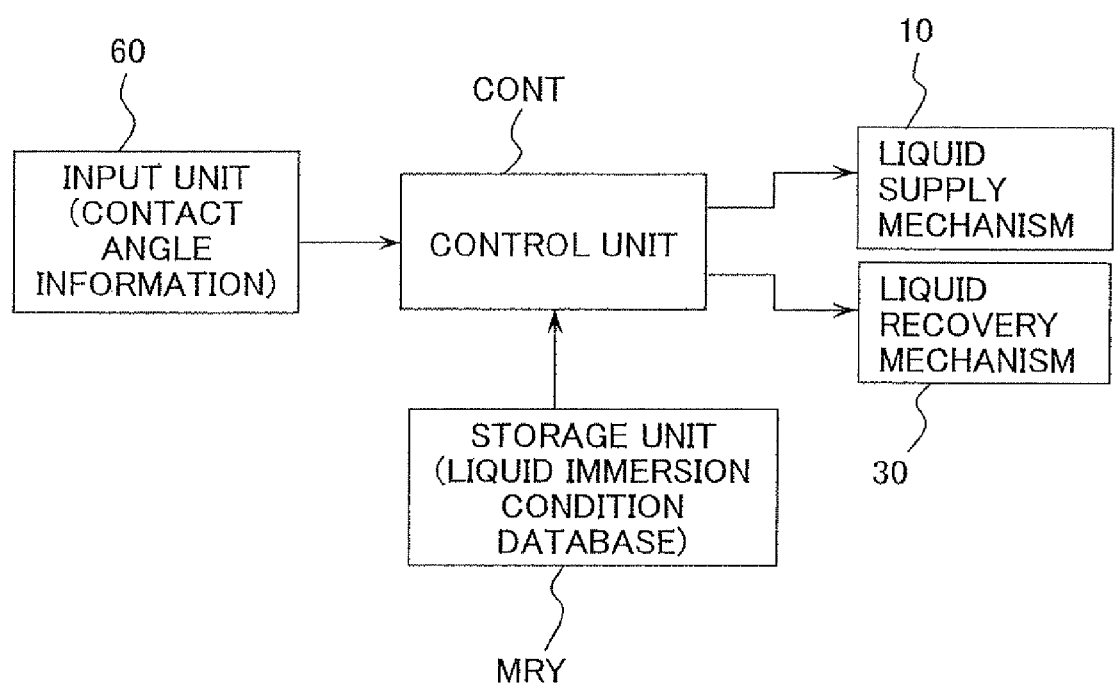
FIG. 5 shows a block diagram illustrating an exemplary control system according to an embodiment of the present invention.

As shown in a block diagram of FIG. 5, the storage unit MRY stores the information about the liquid immersion condition to perform the liquid immersion exposure (liquid immersion condition database). Specifically, the storage unit MRY stores, as a plurality of pieces of map data, the relationships between the affinity between the liquid 1 and the film SP formed as the liquid contact surface which makes contact with the liquid 1 on the substrate P during the liquid immersion exposure and the liquid immersion condition corresponding to the affinity. In this embodiment, the information about the affinity between the liquid 1 and the film SP includes the contact angle information of the liquid 1 with respect to the film SP. Further, the storage unit MRY previously stores the liquid immersion exposure condition corresponding to the material characteristic of the liquid 1 (for example, the volatility, the viscosity, the density, and the surface tension). Alternatively, the following procedure is also available as described later on. That is, various films SP and liquid types preferred for the respective films SP are investigated beforehand. The storage unit MRY stores the combinations of the films SP and the liquid types preferred for the respective films as well as the liquid immersion conditions optimum for the combinations.

When the liquid immersion exposure process is performed, the film information in relation to the substrate P to be subjected to the exposure process is inputted into the control unit CONT via the input unit 60 connected to the control unit CONT. The film information to be inputted includes the information about the contact angle between the film SP and the liquid 1. The control unit CONT makes reference to the relationship (map data) between the affinity (contact angle) between the liquid 1 and the film SP and the liquid immersion condition corresponding to the affinity (contact angle) previously stored in the storage unit MRY to select and determine the optimum liquid immersion condition for the substrate P to be subjected to the exposure process.

In this embodiment, the liquid immersion condition includes the supply condition for supplying the liquid 1 for the liquid immersion exposure onto the substrate P. Further, the supply condition for supplying the liquid 1 includes at least one of the condition in relation to the liquid supply position with respect to the substrate P and the condition in relation to the liquid supply amount per unit time.

Further, the liquid immersion condition includes the recovery condition for recovering the liquid 1 for the liquid immersion exposure from the surface of the substrate P. The recovery condition for recovering the liquid 1 includes at least one of the condition in relation to the liquid recovery position on the substrate P and the condition in relation to the liquid recovery amount (liquid recovery power) per unit time.

For example, the control unit CONT adjusts the liquid supply amount of the liquid supply mechanism 10 and the liquid recovery amount of the liquid recovery mechanism 30 depending on the contact angle of the liquid 1 with respect to the film SP.

Specifically, when the contact angle of the liquid 1 with respect to the film SP is large, the film SP has the liquid repellence (water repellence) with respect to the liquid 1. Therefore, when the liquid 1 is supplied onto the substrate P (film SP), the liquid 1 is not excessively spread while causing the wetting. When the liquid 1 is supplied to such a film SP, for example, the liquid supply mechanism 10 increases the liquid supply amount per unit time. Accordingly, the liquid 1 can be satisfactorily spread while causing the wetting on the surface of the substrate P (film SP). It is possible to smoothly form the liquid immersion area AR2. When the film SP has the liquid repellence, the liquid 1 is easily exfoliated from the substrate P (film SP) when the substrate P is subjected to the scanning movement in order to perform the scanning exposure. However, it is possible to suppress the occurrence of the exfoliation of the liquid 1 by increasing the liquid supply amount.

When the film SP has the liquid repellence (water repellence) with respect to the liquid 1, the liquid 1 is not excessively spread while causing the wetting. Accordingly, it is relatively easy for the liquid recovery mechanism 30 to recover the liquid 1 from the surface of the substrate P (film SP). Therefore, even when the liquid recovery mechanism 30 undergoes the reduction of the liquid recovery power (driving force of the liquid recovery section), i.e., the liquid recovery amount per unit time, it is possible to smoothly recover the liquid 1. Therefore, it is possible to suppress the occurrence of the vibration which would be otherwise caused by the driving of the liquid recovery section.

On the other hand, when the contact angle of the liquid 1 with respect to the film SP is small, the film SP has the lyophilicity or liquid-attracting property (hydrophilicity) with respect to the liquid 1. Therefore, when the liquid 1 is supplied onto the substrate P (film SP), the liquid 1 is spread while causing the wetting with ease. Therefore, when the liquid 1 is supplied to such a film SP, for example, the liquid supply mechanism 10 makes it possible to satisfactorily spread the liquid 1 while causing the wetting on the surface of the substrate P (film SP), even when the liquid supply amount per unit time is decreased. Thus, it is possible to smoothly form the liquid immersion area AR2. Further, it is possible to suppress any waste of the liquid 1, and it is possible to suppress the occurrence of the vibration which would be otherwise caused by the driving of the liquid supply section, because the liquid supply amount can be reduced for the liquid 1.

When the film SP has the lyophilicity (hydrophilicity) with respect to the liquid 1, the liquid 1 is spread while causing the wetting on the substrate P (film SP) with ease. For this reason, there is such a possibility that the liquid 1 may be hardly recovered from the surface of the substrate P (film SP) by the liquid recovery mechanism 30. Therefore, the liquid recovery mechanism 30 increases the liquid recovery force (driving force of the liquid recovery section), i.e., the liquid recovery amount per unit time. Accordingly, it is possible for the liquid recovery mechanism 30 to smoothly recover the liquid 1.

The control unit CONT is capable of adjusting the liquid supply position of the liquid supply mechanism 10 and the liquid recovery position of the liquid recovery mechanism 30 depending on the contact angle of the liquid 1 with respect to the film SP.

For example, when the contact angle of the liquid 1 with respect to the film SP is large, the film SP has the liquid repellence (water repellence) with respect to the liquid 1. Therefore, when the liquid 1 is supplied onto the substrate P (film SP), the liquid 1 is hardly spread while causing the wetting. Therefore, when the substrate P is moved with respect to the liquid 1 in order to perform the scanning exposure, there is such a possibility that the liquid 1 may be easily exfoliated from the substrate P (film SP). When the liquid supply position, at which the liquid 1 is supplied by the liquid supply mechanism 10, is set at the position far from the projection area AR1 of the projection optical system PL, i.e., when the distance at the liquid supply position from the projection area AR1 of the projection optical system PL is made long so that the liquid immersion area AR2 is formed to be large, then it is possible to suppress the occurrence of the exfoliation of the liquid 1 when the substrate P is subjected to the scanning movement. As explained with reference to FIG. 3, the liquid supply position may be adjusted such that the slide member 41 is subjected to the sliding movement with respect to the main body member 40 of the supply member 13, 14.

When the liquid 1 has the liquid repellence (water repellence) with respect to the film SP, the liquid 1 is not excessively spread while causing the wetting. Accordingly, as described above, it is relatively easy for the liquid recovery mechanism 30 to recover the liquid 1 from the surface of the substrate P (film SP). Therefore, even when the liquid recovery position is set at the position near to the projection area AR1 of the projection optical system PL, i.e., even when the distance at the liquid recovery position from the projection area AR1 of the projection optical system PL is shortened, then the liquid recovery mechanism 30 can smoothly recover the liquid 1. Therefore, it is possible to decrease the space occupied by the liquid recovery mechanism 30.

On the other hand, when the contact angle of the liquid 1 with respect to the film SP is small, the film SP has the lyophilicity (hydrophilicity) with respect to the liquid 1. Therefore, when the liquid 1 is supplied onto the substrate P (film SP), the liquid 1 is spread while causing the wetting with ease. Therefore, when the liquid 1 is supplied to such a film SP, the liquid supply position, at which the liquid 1 is supplied by the liquid supply mechanism 10, is set at the position near to the projection area AR1 of the projection optical system PL, i.e., the distance at the liquid supply position from the projection area AR1 of the projection optical system PL is shortened. Accordingly, it is possible to suppress the leakage of the liquid 1 to the outside.

When the liquid 1 has the lyophilicity (hydrophilicity) with respect to the film SP, the liquid 1 is spread while causing the wetting on the substrate P (film SP) with ease. Therefore, there is such a possibility that the liquid 1 may be hardly recovered from the surface of the substrate P (film SP) by the liquid recovery mechanism 30. When the liquid recovery position, at which the liquid 1 is recovered by the liquid recovery mechanism 30, is set at the position far from the projection area AR1 of the projection optical system PL, i.e., when the distance at the liquid recovery position from the projection area AR1 of the projection optical system PL is made long, then the liquid recovery mechanism 30 can smoothly recover the liquid 1. In other words, when the liquid 1 is easily spread while causing the wetting, the liquid is recovered at the position far from the liquid supply position. Accordingly, the liquid 1 can be recovered in a state in which the force of the flow of the supplied liquid 1 is reduced. Therefore, when the liquid 1, which has the lyophilicity with respect to the film SP, is recovered, it is preferable to set the liquid recovery position at the position far from the liquid supply position, i.e., the position far from the projection area AR1.

The control unit CONT is capable of adjusting the sizes of the liquid supply ports 13A, 14A of the liquid supply mechanism 10 and the sizes of the liquid recovery ports 31A, 32A of the liquid recovery mechanism 30 depending on the contact angle of the liquid 1 with respect to the film SP.

For example, when the contact angle of the liquid 1 with respect to the film SP is large, the film SP has the liquid repellence (water repellence) with respect to the liquid 1. Therefore, the liquid 1 is easily exfoliated from the substrate P. In this case, the force of the flow of the liquid 1 to be supplied onto the substrate P is increased by decreasing the sizes of the liquid supply ports 13A, 14A. Accordingly, it is possible to suppress the exfoliation. As explained with reference to FIG. 3, when the size of the liquid supply port is adjusted, it is appropriate to move the shutter member 42 of the supply member 13, 14.

When the liquid 1 has the liquid repellence (water repellence) with respect to the film SP, it is relatively easy to recover the liquid 1 from the surface of the substrate P (film SP) by using the liquid recovery mechanism 30 as described above. In this case, the liquid recovery ports 31A, 32A of the liquid recovery mechanism 30 can be decreased in size. When the liquid recovery ports 31A, 32A are decreased in size, the air is hardly caught and sucked (mixed in the liquid) when the liquid 1 is recovered. Therefore, the liquid recovery mechanism 30 can smoothly recover the liquid 1 from the surface of the substrate P.

On the other hand, when the contact angle of the liquid 1 with respect to the film SP is small, the film SP has the lyophilicity (hydrophilicity) with respect to the liquid 1. Therefore, even when the liquid 1 is supplied onto the substrate P while increasing the sizes of the liquid supply ports 13A, 14A, it is possible to smoothly form the liquid immersion area AR2.

When the liquid 1 has the lyophilicity (hydrophilicity) with respect to the film SP, the liquid 1 is spread while causing the wetting with ease on the substrate P (film SP). Therefore, there is such a possibility that the liquid 1 may be hard to recover from the surface of the substrate P (film SP) by the liquid recovery mechanism 30. Accordingly, when the liquid supply ports 31A, 32A are increased in size to recover the liquid 1 over a wide range, it is possible to smoothly recover the liquid 1 from the surface of the substrate P.

As explained above, the optimum liquid immersion condition (for example, the supply amount, the recovery amount, the supply position, and the recovery position) corresponding to the contact angle (affinity) of the liquid 1 for the film SP is previously determined, and the information, which relates to the optimum liquid immersion condition, is stored in the storage unit MRY. Accordingly, the control unit CONT selects and determines the optimum liquid immersion condition from the plurality of stored liquid immersion conditions on the basis of the information which is inputted by the aid of the input unit 60 and which relates to the film SP of the substrate P to be subjected to the exposure process (information about the contact angle of the film SP in relation to the liquid 1). The optimum liquid supply amount, the optimum liquid recovery amount, the optimum liquid supply position, and/or the optimum liquid recovery position is set on the basis of the selected liquid immersion condition as described above. The control unit CONT performs the liquid immersion exposure for the substrate P in this state.

The liquid immersion exposure process is performed as follows. The control unit CONT uses the substrate transport system to load the substrate P on the substrate stage PST, and then the liquid supply mechanism 10 is driven to start the liquid supply operation for supplying the liquid onto the substrate P. The liquid 1, which is fed from the first and second liquid supply sections 11, 12 of the liquid supply mechanism 10 in order to form the liquid immersion area AR2, flows through the first and second piping systems 15, 16, and then the liquid 1 is supplied onto the substrate P via the first and second supply members 13, 14 to form the liquid immersion area AR2 between the projection optical system PL and the substrate P. The supply ports 13A, 14A of the first and second supply members 13, 14 are arranged on the both sides in the X axis direction (scanning direction) of the projection area AR1. The control unit CONT simultaneously supplies the liquid 1 onto the substrate P from the supply ports 13A, 14A. Accordingly, the liquid 1, which is supplied onto the substrate P, forms, on the substrate P, the liquid immersion area AR2 in a range wider than at least the projection area AR1.

In this embodiment, when the liquid 1 is supplied to the substrate P from the both sides in the scanning direction of the projection area AR1, the control unit CONT controls the liquid supply operation of the first and second liquid supply sections 11, 12 of the liquid supply mechanism 10 so that the liquid supply amount per unit time, which is to be supplied from the side in front of the projection area AR1 in relation to the scanning direction, is set to be larger than the liquid supply amount to be supplied from the side opposite thereto. For example, when the exposure process is performed while moving the substrate P in the +X direction, the control unit CONT performs the setting so that the liquid amount from the −X side with respect to the projection area AR1 (i.e., from the supply ports 13A) is larger than the liquid amount from the +X side (i.e., from the supply ports 14A). On the other hand, when the exposure process is performed while moving the substrate P in the −X direction, the control unit CONT performs the setting so that the liquid amount from the +X side with respect to the projection area AR1 is larger than the liquid amount from the −X side.

Further, the control unit CONT controls the first and second liquid recovery sections 33, 34 of the liquid recovery mechanism 30 to perform the liquid recovery operation for recovering the liquid 1 from the surface of the substrate P concurrently with the supply operation for supplying the liquid 1 by the liquid supply mechanism 10. Accordingly, the liquid 1 on the substrate P, which flows to the outside of the projection area AR1 from the supply ports 13A, 14A of the first and second supply members 13, 14, is recovered from the recovery ports 31A, 32A of the first and second recovery members 33, 34. As described above, the liquid recovery mechanism 30 recovers the liquid 1 from the surface of the substrate P by using the recovery ports 31A, 32A provided to surround the projection area AR1.

In this embodiment, the control unit CONT can select and determine the liquid immersion condition taking the movement condition of the substrate P into consideration as well. For example, when the scanning exposure is performed while moving the substrate P, if the film SP of the substrate P has the affinity for the liquid 1, then the liquid 1 is satisfactorily spread while causing the wetting on the substrate P, and it is possible to smoothly form the liquid immersion area AR2 by supplying the liquid 1 from only one side in the scanning direction as well. For example, when the liquid immersion exposure is performed while moving the substrate P in the +X direction, then the liquid supply mechanism 10 can supply the liquid 1 from the first supply member 13, and the liquid supply from the second supply member 14 can be stopped, or the liquid supply amount from the second supply member 14 can be made smaller than the liquid supply amount from the first supply member 13. On the other hand, when the film SP of the substrate P has the liquid repellence with respect to the liquid 1, the liquid immersion area AR2 can be smoothly formed by supplying the liquid 1 from the both sides in the scanning direction.

Further, the control unit CONT determines the liquid immersion condition depending on the velocity or the acceleration of the substrate P in the X axis direction (scanning direction). For example, when the scanning velocity (or acceleration) of the substrate P is high, then the control unit CONT increases the liquid supply amount for the substrate P, and the control unit CONT increases the liquid recovery power on the substrate P. On the other hand, when the scanning velocity (or acceleration) of the substrate P is relatively low, the liquid immersion area AR can be smoothly formed, even if the control unit CONT decreases the liquid supply amount for the substrate P, and the control unit CONT reduces the liquid recovery force on the substrate P.

When the scanning velocity (or acceleration) of the substrate P is high, the exfoliation of the liquid 1 is easily caused. Therefore, the liquid supply mechanism 10 increases the liquid supply amount per unit time, and the supply position is set to the position far from the projection area AR1 of the projection optical system PL to increase the liquid immersion area AR2. Accordingly, it is possible to suppress the occurrence of the exfoliation of the liquid 1. Similarly, when the scanning velocity (or acceleration) of the substrate P is high, it is difficult to recover the liquid 1 from the surface of the substrate P. Therefore, the liquid recovery force exerted by the liquid recovery mechanism 30 is increased. Further, the recovery position is set to the position far from the projection area AR1 of the projection optical system PL to recover the liquid 1 at the position at which the force of the flow of the liquid 1 is reduced. Thus, it is possible to smoothly recover the liquid 1.

Further, the control unit CONT determines the liquid immersion condition depending on the movement direction of the substrate P including the scanning direction (X axis direction) and the stepping movement direction (Y axis direction) of the substrate P. For example, when the substrate P undergoes the stepping movement in the Y axis direction, then the liquid recovery operation performed by the liquid supply mechanism 10 is stopped, or the liquid supply amount is reduced as compared with the situation in which the scanning exposure is performed. On the other hand, the control unit CONT is capable of making the control such that the liquid recovery amount is increased for the recovery members 31, 32 arranged on the side in the Y direction with respect to the projection area AR1, of the plurality of recovery members 31, 32 arranged to surround the projection area AR1.

Further, the control unit CONT is also capable of changing the shapes of the liquid supply ports 13A, 14A and the shapes of the liquid recovery ports 31A, 32A as one of the liquid immersion conditions, depending on the film SP. In this embodiment, the shutter member 42 can be driven to make the change for the supply port or the recovery port between the wide width slit shape (substantially square shape) and the narrow width slit shape (rectangular shape). However, for example, it is also allowable to select and determine various shapes, for example, such that the shapes of the supply port and the recovery port are circular, elliptical, or polygonal depending on the film SP.

As described above, the exposure apparatus EX of this embodiment is capable of switching pure water as the first liquid and fluorine-based oil as the second liquid to supply the liquid onto the substrate P. The control unit CONT changes the liquid 1 to be supplied onto the substrate P depending on the film SP of the substrate P to be subjected to the exposure process. For example, when the film SP is composed of a substance such as an amine-based substance which is easily soluble in pure water, it is preferable that fluorine-based oil is used as the liquid 1 for the liquid immersion exposure. After the information about the film SP is inputted by the aid of the input unit 60, the control unit CONT controls the liquid supply mechanism 10 to select the liquid 1 to be supplied to the substrate P. Subsequently, the control unit CONT determines the liquid immersion condition depending on the liquid 1 to be used.

The storage unit MRY also stores beforehand the relationship between the affinity between the film SP and the liquid (second liquid) 1 and the liquid immersion condition corresponding to the affinity. The control unit CONT determines the liquid immersion condition including the liquid supply amount, the liquid recovery amount, the liquid supply position, and the liquid recovery position depending on the substrate P (film SP) to be subjected to the exposure process.

When the liquid 1 to be supplied onto the substrate P is changed depending on the film SP, the storage unit MRY can store the combination of the film SP and the liquid type preferred for the film SP as well as the liquid immersion condition adopted when the combination is used. Accordingly, when the operator for the exposure apparatus selects (inputs) the film SP, the liquid immersion condition including the liquid type is automatically determined. That is, the selection of the liquid type can be also regarded as one of the liquid immersion conditions. As for the film SP, it is possible to previously store, for example, the material for the photoresist, the manufacturer, and the article number.

The liquid immersion condition may be changed depending on the material characteristic of the liquid 1 to be supplied onto the substrate P. For example, when the liquid 1 is an easily volatile liquid, the liquid supply amount per unit time is increased. Accordingly, even when the liquid 1 is easily volatile, it is possible to smoothly form the liquid immersion area AR2. When the easily volatile liquid 1 is used, the liquid 1 is removed by the volatilization from the substrate P. Therefore, for example, it is also possible to reduce the liquid recovery power. In other words, the control unit CONT can adjust the liquid immersion condition depending on the volatility which is included in the material characteristic of the liquid 1 to be supplied onto the substrate P.

When the liquid 1 to be supplied onto the substrate P is highly viscous, for example, the force for holding the substrate P, which is exerted by the substrate holder on the substrate P, is increased. Thus, the control unit CONT can adjust the liquid immersion exposure condition depending on the viscosity which is included in the material characteristic of the liquid 1. In other words, when the viscosity of the liquid 1 is high, then the substrate P is pulled by the liquid 1 due to the viscosity of the liquid 1 when the scanning exposure is performed, and the position of the substrate P with respect to the substrate holder is possibly deviated during the exposure. In this embodiment, the control unit CONT can adjust the holding force for the substrate P exerted by the substrate holder depending on the viscosity of the liquid 1. Specifically, when the substrate holder has such a structure that the substrate P is attracted and held in vacuum by the aid of vacuum attraction holes, the vacuum attraction force, which is exerted on the substrate P, is increased by the control unit CONT. On the other hand, when the viscosity of the liquid 1 is low, the possibility of the deviation of the substrate P during the scanning exposure is lowered. Therefore, taking the warpage of the substrate P into consideration, it is possible to make the control to reduce the vacuum attraction force for the substrate P by the control unit CONT.

Further, when the liquid 1 is changed, the specific heat of the liquid 1 is changed as well. Therefore, it is possible, for example, to control the inclination and the focus position of the substrate P, and/or to adjust the light amount of the exposure light beam EL by considering the change of the refractive index of the liquid 1 caused by the temperature change of the liquid 1. For example, it is also possible to make the control for correcting the result of the focus position detection by the focus-detecting system 4. When the affinity (contact angle) between the liquid 1 and the film SP is changed, the pressure, which is exerted on the substrate P by the liquid 1, is also changed. Therefore, it is possible to control the inclination and the focus position of the substrate P by considering the change of the pressure exerted on the substrate P by the liquid 1 as well.

It is considered that the image formation characteristic of the image, which is obtained via the projection optical system PL and the liquid 1, is changed when the liquid 1 is changed. In such a situation, the control unit CONT drives the image formation characteristic control unit 3 on the basis of the material characteristic and the optical characteristic of the liquid 1 previously stored in the storage unit MRY. Accordingly, it is possible to correct the change of the image formation characteristic brought about by the change of the liquid 1. Further, the control unit CONT can also adjust the surface of the substrate P to match the image plane position having been changed by the change of the liquid 1, by adjusting the position in the Z axis direction and the posture in the $\theta X$ and $\theta Y$ directions of the substrate stage PST.

The map data stored in the storage unit MRY can be updated at any time. When the substrate P having any film SP of any different type is subjected to the exposure, or when the liquid 1 of any new type is used, then the map data may be prepared, for example, by performing the experiment for the new film SP or the liquid 1, and the map data stored in the storage unit MRY may be updated. The map data can be also updated from a remote place for the exposure apparatus EX (storage unit MRY), for example, by using any communication unit including the Internet.

In the embodiment described above, the liquid supply mechanism 10 is capable of supplying the two types of the liquids depending on the film SP. However, it is also allowable to adopt such an arrangement that only one type of the liquid is supplied. Alternatively, it is also allowable to adopt such an arrangement that three or more types of liquids can be supplied. In the embodiment described above, the storage unit MRY stores the relationship between the affinity between the film SP and the liquid 1 and the liquid immersion condition corresponding to the affinity. However, when the type of the film SP to be used and the type of the liquid 1 to be used are previously known, the relationship between the film SP and the liquid immersion condition may be stored beforehand in the storage unit MRY to immediately determine the liquid immersion condition from the information about the film SP selected (inputted) by the operator or the like.

In the embodiment of the present invention, when the liquid immersion condition is determined depending on the contact angle (affinity) between the liquid 1 and the film SP, the consideration is made for the movement condition of the substrate P (for example, any one of or both of the velocity and the acceleration of the substrate P during the scanning exposure). However, the movement condition of the substrate P (for example, any one of or both of the velocity and the acceleration of the substrate P during the scanning exposure) may be determined depending on the contact angle (affinity) between the film SP and the liquid 1. For example, when the affinity of the film SP for the liquid 1 is relatively high, the velocity and/or the acceleration of the substrate P is increased in the scanning exposure. When the affinity between the film SP and the liquid 1 is relatively high, the liquid 1 is easily spread while causing the wetting on the substrate P. Therefore, even when the velocity and/or the acceleration of the substrate P is increased, it is possible to smoothly form the liquid immersion area AR2. On the contrary, when the affinity of the film SP for the liquid 1 is relatively low, the liquid 1 is hardly spread while causing the wetting on the substrate P. Therefore, if the velocity and/or the acceleration of the substrate P is excessively increased, then the exfoliation or the like of the liquid 1 is caused, and there is such a possibility that the space between the projection optical system PL and the substrate P cannot be sufficiently filled with the liquid 1. When the affinity of the film SP for the liquid 1 is relatively low, the velocity and/or the acceleration of the substrate P is decreased during the scanning exposure. Further, the movement condition of the substrate P can be also determined on the basis of the liquid immersion condition determined depending on the film SP. For example, when the liquid recovery mechanism 30 has the small liquid recovery power as determined depending on the film SP, it is possible to avoid the exfoliation and the leakage of the liquid 1 by decreasing the scanning velocity and the acceleration of the substrate P.

The embodiment of the present invention is constructed such that the contact angle (affinity) between the film SP and the liquid 1 is previously determined, for example, by the experiment, and the liquid immersion condition corresponding to the determined contact angle is stored in the storage unit MRY beforehand. However, the affinity between the liquid 1 and the film SP formed as the liquid contact surface of the substrate P may be measured before the exposure process by using a measuring unit provided for the exposure apparatus EX, and the liquid immersion condition may be determined on the basis of the result of the measurement.

Figure 6A:
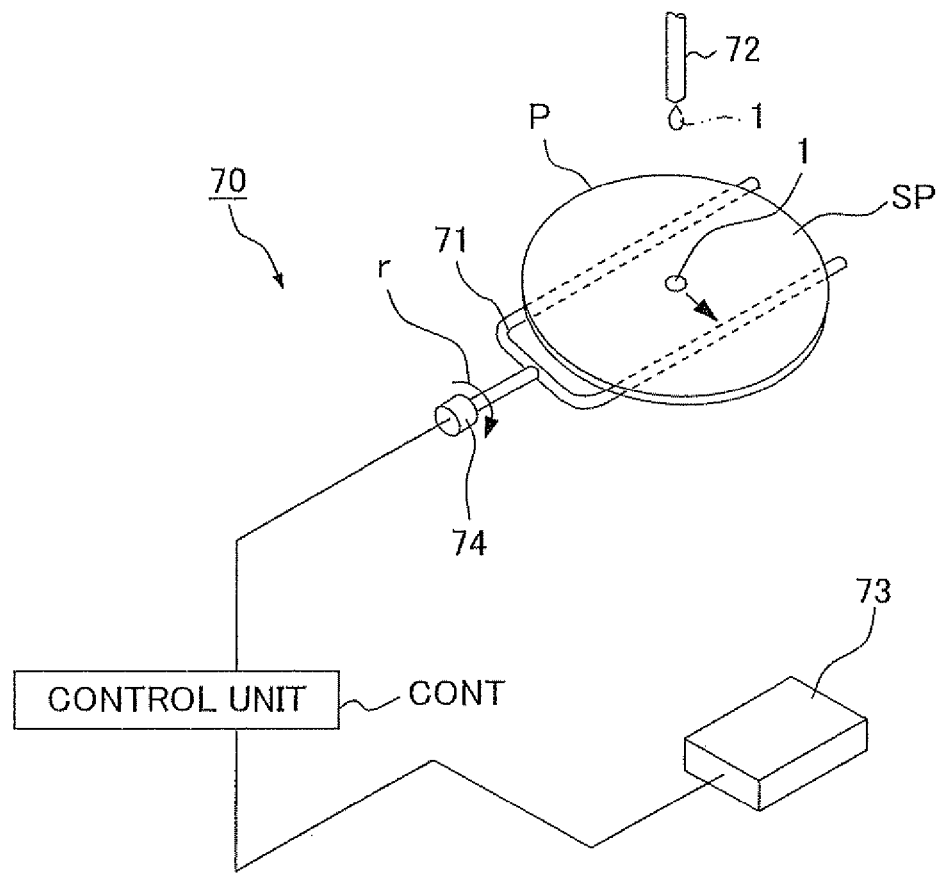
FIGS. 6A and 6B show a schematic arrangement illustrating an embodiment of a measuring unit.
Figure 6B:
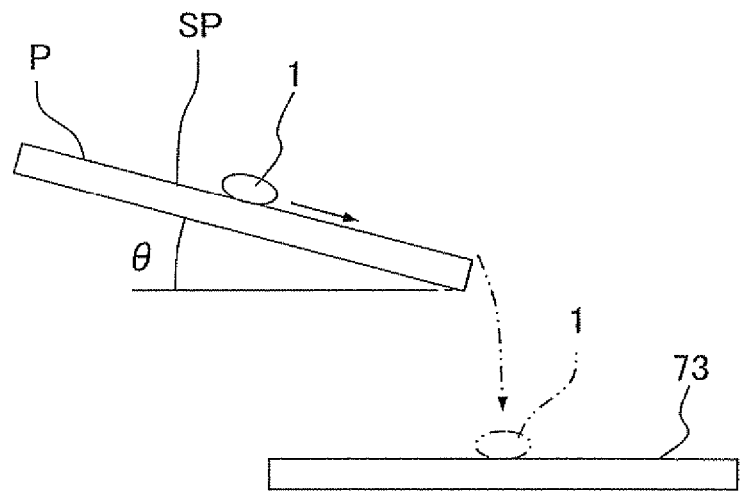

FIGS. 6A and 6B schematically show a measuring unit 70 for measuring the affinity between the film SP and the liquid 1. In this embodiment, the measuring unit 70 is provided on a transport passage for the substrate P. With reference to FIG. 6A, the measuring unit 70 includes a loader hand 71 which constructs a part of a substrate transport system, a dripping section 72 which is capable of dripping the liquid droplet of the liquid 1 onto the substrate P held by the loader hand 71, and a detecting section 73 which is capable of detecting the liquid droplet of the liquid 1. The loader hand 71 loads the substrate P to be subjected to the exposure process to the substrate stage PST. The loader hand 71 has a rotary driving section 74 which rotates the loader hand 71 in the axial direction. The loader hand 71 is rotatable in a state in which the substrate P is held. The driving operation of the rotary driving section 74 is controlled by the control unit CONT. The detecting section 73 outputs the detection signal of the liquid droplet to the control unit CONT.

When the affinity (contact angle) between the film SP and the liquid 1 is measured, the liquid droplet of the liquid 1 is dripped from the dripping section 72 to the film SP of the substrate P in a state in which the loader hand 7 holds the substrate P horizontally. When the liquid droplet of the liquid 1 is arranged on the film SP of the substrate P, the held substrate P is inclined by rotating the loader hand 71 in the direction indicated by the arrow "r" shown in FIG. 6A. As the substrate P is inclined, as shown in FIG. 6B, the liquid 1 falls from the surface of the substrate P (film SP) as if the liquid 1 rolls. The fallen liquid 1 is detected by the detecting section 73. The detection signal is outputted to the control unit CONT. The control unit CONT determines the angle of inclination (rolling angle) $\theta$ of the substrate P at this time from the driving amount of the rotary driving section 74. The rolling angle $\theta$ is the angle at which the liquid droplet of the liquid 1 on the surface of the film SP of the substrate P rolls and falls when the substrate P is inclined with respect to the horizontal plane. The rolling angle corresponds to the contact angle of the liquid 1 with respect to the film SP. For example, when the rolling angle $\theta$ is small, then the film SP has the liquid repellence with respect to the liquid 1, and the contact angle is large. Therefore, when the rolling angle $\theta$ is determined, it is possible to determine the contact angle of the liquid 1 with respect to the film SP. The control unit CONT sets the liquid immersion condition on the basis of the contact angle measured by the measuring unit 70 to perform the liquid immersion exposure for the substrate P loaded on the substrate stage PST by the loader hand 71.

Figure 7A:
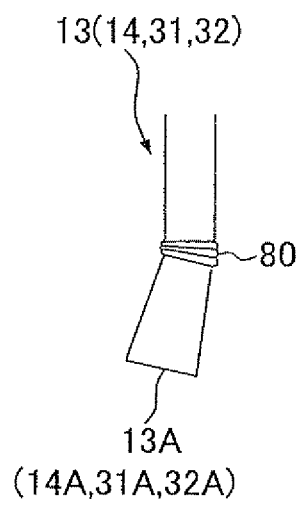
FIGS. 7A and 7B show sectional views illustrating an embodiment of the supply member and the recovery member.
Figure 7B:
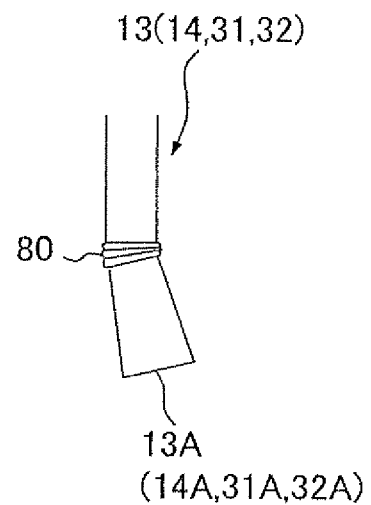

In the embodiment of the present invention, as explained with reference to FIG. 3, the slide mechanism is provided for each of the supply members 13, 14 and the recovery members 31, 32 to change the liquid supply position and the liquid recovery position by driving the slide mechanism. However, as shown in FIGS. 7A and 7B, the following arrangement is also available. That is, parts of the supply member and the recovery member are constructed with flexible tubes 80. As shown in FIGS. 7A and 7B, the supply position and the recovery position are changed by bending the tubes 80.

The exposure apparatus EX of the embodiment described above is capable of switching and using pure water and fluorine-based oil as the liquid 1. Pure water is advantageous in that pure water is available in a large amount with ease, for example, in the semiconductor production factory, and pure water exerts no harmful influence, for example, on the optical element (lens) and the photoresist of the substrate P. Further, pure water exerts no harmful influence on the environment, and the content of impurity is extremely low. Therefore, it is also expected to obtain the function to wash the surface of the substrate P and the surface of the optical element provided at the end surface of the projection optical system PL.

It is approved that the refractive index n of pure water (water) with respect to the exposure light beam EL having a wavelength of about 193 nm is approximately in an extent of 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In the embodiment of the present invention, the optical element 2 is attached to the end portion of the projection optical system PL. The lens can be used to adjust the optical characteristics of the projection optical system PL, including, for example, the aberration (for example, spherical aberration and comatic aberration). The optical element 2, which is attached to the end portion of the projection optical system PL, may be an optical plate usable to adjust the optical characteristic of the projection optical system PL. Alternatively, the optical element 2 may be a plane parallel plate through which the exposure light beam EL is transmissive. When the optical element 2 to make contact with the liquid 1 is the plane parallel plate which is cheaper than the lens, it is enough that the plane parallel plate is merely exchanged immediately before supplying the liquid 1 even when any substance (for example, any silicon-based organic matter), which deteriorates the transmittance of the projection optical system PL, the illuminance of the exposure light beam EL on the substrate P, and the uniformity of the illuminance distribution, is adhered to the plane parallel plate, for example, during the transport, the assembling, and/or the adjustment of the exposure apparatus EX. An advantage is obtained such that the exchange cost is lowered as compared with the case in which the optical element to make contact with the liquid 1 is the lens. That is, the surface of the optical element to make contact with the liquid 1 is dirtied, for example, due to the adhesion of scattered particles generated from the resist by being irradiated with the exposure light beam EL or any adhered impurity contained in the liquid 1. Therefore, it is necessary to periodically exchange the optical element. However, when the optical element is the cheap plane parallel plate, then the cost of the exchange part is low as compared with the lens, and it is possible to shorten the time required for the exchange. Thus, it is possible to suppress the increase in the maintenance cost (running cost) and the decrease in the throughput.

When the pressure, which is generated by the flow of the liquid 1, is large between the substrate P and the optical element disposed at the end portion of the projection optical system PL, it is also allowable that the optical element is tightly fixed so that the optical element is not moved by the pressure, rather than allowing the optical element to be exchangeable.

The embodiment of the present invention is constructed such that the space between the projection optical system PL and the surface of the substrate P is filled with the liquid 1. However, for example, another arrangement may be adopted such that the space is filled with the liquid 1 in a state in which a cover glass constructed of a plane parallel plate is attached to the surface of the substrate P.

On the other hand, for example, when the light source of the exposure light beam EL is the $F_2$ laser, the $F_2$ laser beam is not transmitted through water. Therefore, in this case, those preferably usable as the liquid 1 may include, for example, a fluorine-based fluid such as fluorine-based oil as described above through which the $F_2$ laser beam is transmissive. In this case, the portion to make contact with the liquid 1 is subjected to the liquid-attracting treatment by forming a thin film, for example, with a substance having a molecular structure of small polarity including fluorine. Alternatively, other than the above, it is also possible to use, as the liquid 1, those (for example, cedar oil) which have the transmittance with respect to the exposure light beam EL, which have the refractive index as high as possible, and which are stable against the photoresist coated on the surface of the substrate P and the projection optical system PL. Also in this case, the surface treatment is performed depending on the polarity of the liquid 1 to be used.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic quartz, silicon wafer) for the mask or the reticle to be used for the exposure apparatus.

As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are allowed to stand still, while successively step-moving the substrate P. The present invention is also applicable to the exposure apparatus based on the step-and-stitch system in which at least two patterns are partially overlaid and transferred on the substrate P.

The present invention is also applicable to a twin-stage type exposure apparatus. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

As for the type of the exposure apparatus EX, the present invention is not limited to the exposure apparatus for the semiconductor device production apparatus for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), contents of which are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 8:
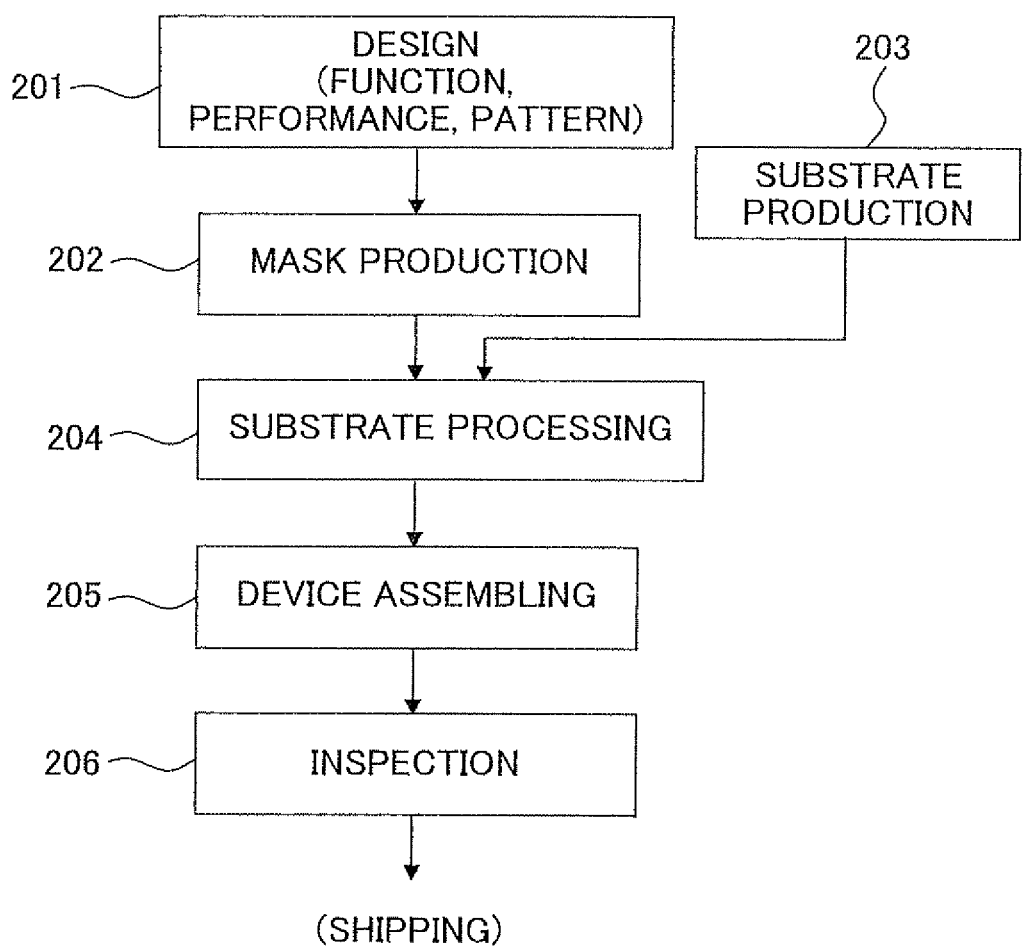
FIG. 8 shows a flow chart illustrating exemplary steps of producing a semiconductor device according to an embodiment of the present invention.

As shown in FIG. 8, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including a dicing step, a bonding step, and a packaging step), and an inspection step 206.

According to the present invention, the liquid immersion condition, under which the substrate is dealt with, is determined depending on the film formed as the liquid contact surface of the substrate. Accordingly, the liquid immersion exposure process can be smoothly performed for a plurality of substrates provided with films of different types. It is possible to possess the high versatility. In particular, the present invention contributes to the high throughput production of the highly integrated device by quickly switching the liquid immersion condition in the production line for performing the exposure process for a variety of different objectives including, for example, the semiconductor device and the liquid crystal display device.

What is claimed is:

1. A liquid immersion exposure apparatus that exposes a substrate via a projection optical system and a liquid, the apparatus comprising:
    a liquid immersion member provided surrounding an optical element of the projection optical system and configured to form, with the liquid, a liquid immersion area below the projection optical system, the optical element being arranged to be in contact with the liquid;
    a substrate stage having a holder to hold the substrate, the substrate stage being configured to move below the projection optical system such that the substrate is relatively moved with respect to the liquid immersion area that is maintained between the projection optical system and a portion of the substrate; and
    a driving system having an electromagnetic motor of which a portion is provided in the substrate stage, the driving system being configured to drive the substrate stage, in the relative movement, at least one of a velocity and an acceleration that are determined based on information about a contact angle between the substrate and the liquid of the liquid immersion area.

2. The liquid immersion exposure apparatus according to claim 1, further comprising:
    a controller configured to control the driving system to drive the substrate stage based on at least the one of the velocity and the acceleration that are determined.

3. The liquid immersion exposure apparatus according to claim 2, wherein
    the substrate stage is configured such that each of substrates having surfaces of which the contact angles are different to each other is placed on the substrate stage, and wherein
    at least the one of the velocity and the acceleration that are determined is different between the substrates.

4. The liquid immersion exposure apparatus according to claim 3, wherein the substrates include a first substrate and a second substrate, the contact angle of the second substrate being smaller than the contact angle of the first substrate, and wherein
    at least the one of the velocity and the acceleration that are determined for the second substrate is greater than at least the one of the velocity and the acceleration that are determined for the first substrate.

5. A liquid immersion exposure apparatus that exposes a substrate via a projection optical system and a liquid, the apparatus comprising:
    a liquid immersion member provided surrounding an optical element of the projection optical system and configured to form, with the liquid, a liquid immersion area below the projection optical system, the optical element being arranged to be in contact with the liquid;
    a substrate stage having a holder to hold each of substrates, the substrates having surfaces of which contact angles with the liquid of the liquid immersion area are different to each other;
    a driving system having an electromagnetic motor of which a portion is provided in the substrate stage, the driving system being configured to move the substrate stage below the projection optical system such that the substrate is relatively moved with respect to the liquid immersion area that is maintained between the projection optical system and a portion of the substrate; and
    a controller configured to control the driving system to drive the substrate stage such that at least one of a velocity and an acceleration in the relative movement is different between the substrates.

6. The liquid immersion exposure apparatus according to claim 5, wherein
    at least the one of the velocity and the acceleration is relatively greater for a substrate, of which the contact angle is relatively smaller.

7. The liquid immersion exposure apparatus according to claim 5, wherein
    the substrates include a first substrate and a second substrate, the contact angle of the second substrate being smaller than the contact angle of the first substrate, and wherein
    at least the one of the velocity and the acceleration of the second substrate is greater than at least the one of the velocity and the acceleration of the first substrate.

8. The liquid immersion exposure apparatus according to claim 5, wherein
    the substrate stage is driven such that at least the one of the velocity and the acceleration in the exposure operation of the substrate is different between the substrates.

9. The liquid immersion exposure apparatus according to claim 5, wherein
    a scanning exposure is performed for each of the substrates, and wherein
    the substrate stage is driven such that at least the one of the velocity and the acceleration in the scanning exposure is different between the substrates.

10. The liquid immersion exposure apparatus according to claim 5, wherein
    the controller controls the driving system to drive the substrate stage, in the relative movement, at least the one of the velocity and the acceleration that are determined based on information about the contact angle of the substrate that is held by the substrate stage.

11. The liquid immersion exposure apparatus according to claim 10, wherein the information about the contact angle includes information about a film member of the substrate, the film member being arranged to be in contact with the liquid.

12. The liquid immersion exposure apparatus according to claim 11, wherein
the film member is provided as a photoresist layer of the substrate or a protective layer of the substrate.

13. The liquid immersion exposure apparatus according to claim 10, further comprising:
an input device that is connected to the controller, wherein
the controller determines at least the one of the velocity and the acceleration of the substrate stage in the relative movement, based on the information about the contact angle, the information being input via the input device.

14. The liquid immersion exposure apparatus according to claim 10, further comprising:
a memory that stores the information about the contact angle, wherein
the controller determines at least the one of the velocity and the acceleration of the substrate stage in the relative movement, based on the information about the contact angle that is stored in the memory.

15. The liquid immersion exposure apparatus according to claim 10, wherein
at least the one of the velocity and the acceleration that are allowed in the relative movement is different between the substrates.

16. The liquid immersion exposure apparatus according to claim 10, wherein
the substrate stage is driven at least the one of the velocity and the acceleration that are allowed in the relative movement.

17. The liquid immersion exposure apparatus according to claim 5, wherein
a liquid immersion condition for forming the liquid immersion area is different depending on at least the one of the velocity and the acceleration in the relative movement.

18. The liquid immersion exposure apparatus according to claim 5, wherein
a liquid immersion condition for forming the liquid immersion area is adjusted corresponding to information about the contact angle.

19. The liquid immersion exposure apparatus according to claim 5, wherein
a liquid is supplied to the liquid immersion area via the liquid immersion member and a liquid is recovered from the liquid immersion area via the liquid immersion member, and wherein
a portion of the liquid immersion member is movable in a direction perpendicular to an optical axis of the projection optical system.

20. A method for producing a device comprising:
a step of an exposure process; and
a step of a device assembling, wherein
in the step of the exposure process, a substrate is exposed by using the liquid immersion exposure apparatus according to claim 5.

21. A liquid immersion exposure method that exposes a substrate via a projection optical system and a liquid, the method comprising:
forming a liquid immersion area below the projection optical system with the liquid; and
moving, below the projection optical system, a substrate stage on which the substrate is placed, such that the substrate is relatively moved with respect to the liquid immersion area that is maintained between the projection optical system and a portion of the substrate, wherein
in the relative movement, the substrate stage is driven at least one of a velocity and an acceleration that are determined based on information about a contact angle between the substrate and the liquid of the liquid immersion area.

22. The liquid immersion exposure method according to claim 21, wherein
the driving of the substrate stage is controlled based on at least the one of the velocity and the acceleration that are determined.

23. The liquid immersion exposure method according to claim 22, wherein
the substrate stage is configured such that each of substrates having surfaces of which the contact angles are different to each other is placed on the substrate stage, and wherein
at least the one of the velocity and the acceleration that are determined is different between the substrates.

24. The liquid immersion exposure method according to claim 23, wherein
the substrates include a first substrate and a second substrate, the contact angle of the second substrate being smaller than the contact angle of the first substrate, and wherein
at least the one of the velocity and the acceleration that are determined for the second substrate is greater than at least the one of the velocity and the acceleration that are determined for the first substrate.

25. A liquid immersion exposure method that exposes a substrate via a projection optical system and a liquid, the method comprising:
forming a liquid immersion area below the projection optical system with the liquid; and
moving, below the projection optical system, a substrate stage on which the substrate is placed, such that the substrate is relatively moved with respect to the liquid immersion area that is maintained between the projection optical system and a portion of the substrate, wherein
each of substrates having surfaces of which contact angles with the liquid of the liquid immersion area are different to each other is placed on the substrate stage, and wherein
the substrate stage is moved such that at least one of a velocity and an acceleration in the relative movement is different between the substrates.

26. The liquid immersion exposure method according to claim 25, wherein
at least the one of the velocity and the acceleration is relatively greater for a substrate, of which the contact angle is relatively smaller.

27. The liquid immersion exposure method according to claim 25, wherein
the substrates include a first substrate and a second substrate, the contact angle of the second substrate being smaller than the contact angle of the first substrate, and wherein
at least the one of the velocity and the acceleration of the second substrate is greater than at least the one of the velocity and the acceleration of the first substrate.

28. The liquid immersion exposure method according to claim 25, wherein the substrate stage is driven such that at least the one of the velocity and the acceleration in the exposure operation of the substrate is different between the substrates.

29. The liquid immersion exposure method according to claim 25, wherein
a scanning exposure is performed for each of the substrates, and wherein
the substrate stage is driven such that at least the one of the velocity and the acceleration in the scanning exposure is different between the substrates.

30. The liquid immersion exposure method according to claim 25, wherein
the substrate stage is moved, in the relative movement, at least the one of the velocity and the acceleration that are determined based on information about the contact angle of the substrate that is held by the substrate stage.

31. The liquid immersion exposure method according to claim 30, wherein
the information about the contact angle includes information about a film member of the substrate, the film member being arranged to be in contact with the liquid.

32. The liquid immersion exposure method according to claim 31, wherein
the film member is provided as a photoresist layer of the substrate or a protective layer of the substrate.

33. The liquid immersion exposure method according to claim 30, wherein
at least the one of the velocity and the acceleration that are allowed in the relative movement is different between the substrates.

34. The liquid immersion exposure method according to claim 30, wherein
the substrate stage is driven at least the one of the velocity and the acceleration that are allowed in the relative movement.

35. The liquid immersion exposure method according to claim 25, wherein
a liquid immersion condition for forming the liquid immersion area is different depending on at least the one of the velocity and the acceleration in the relative movement.

36. The liquid immersion exposure method according to claim 25, wherein
a liquid immersion condition for forming the liquid immersion area is adjusted corresponding to information about the contact angle.

37. The liquid immersion exposure method according to claim 25, wherein
a liquid is supplied to the liquid immersion area via a liquid immersion member that is provided surrounding an optical element of the projection optical system, the optical element being arranged to be in contact with the liquid, and a liquid is recovered from the liquid immersion area via the liquid immersion member, and wherein
a portion of the liquid immersion member is movable in a direction perpendicular to an optical axis of the projection optical system.

38. A method for producing a device comprising:
a step of an exposure process; and
a step of a device assembling, wherein
in the step of the exposure process, a substrate is exposed by using the liquid immersion exposure method according to claim 25.

39. A method for producing a liquid immersion exposure apparatus that exposes a substrate via a projection optical system and a liquid, the method comprising:
providing a liquid immersion member provided surrounding an optical element of the projection optical system and configured to form, with the liquid, a liquid immersion area below the projection optical system, the optical element being arranged to be in contact with the liquid;
providing a substrate stage having a holder to hold the substrate, the substrate stage being configured to move below the projection optical system such that the substrate is relatively moved with respect to the liquid immersion area that is maintained between the projection optical system and a portion of the substrate; and
providing a driving system having an electromagnetic motor of which a portion is provided in the substrate stage, the driving system being configured to drive the substrate stage, in the relative movement, at least one of a velocity and an acceleration that are determined based on information about a contact angle between the substrate and the liquid of the liquid immersion area.

40. A method for producing a liquid immersion exposure apparatus that exposes a substrate via a projection optical system and a liquid, the method comprising:
providing a liquid immersion member provided surrounding an optical element of the projection optical system and configured to form, with the liquid, a liquid immersion area below the projection optical system, the optical element being arranged to be in contact with the liquid;
providing a substrate stage having a holder to hold the substrate, the substrate stage being configured to hold each of substrates, the substrates having surfaces of which contact angles with the liquid of the liquid immersion area are different to each other;
providing a driving system having an electromagnetic motor of which a portion is provided in the substrate stage, the driving system being configured to move the substrate stage below the projection optical system such that the substrate is relatively moved with respect to the liquid immersion area that is maintained between the projection optical system and a portion of the substrate; and
providing a controller configured to control the driving system to drive the substrate stage such that at least one of a velocity and an acceleration in the relative movement is different between the substrates.

* * * * *